United States Patent
Park et al.

(10) Patent No.: US 11,133,352 B2
(45) Date of Patent: Sep. 28, 2021

(54) OPTICAL WIRELESS COMMUNICATIONS SYSTEMS

(71) Applicant: Samsung Electronics Co., Ltd., Suwon-si (KR)

(72) Inventors: Sung Jun Park, Yongin-si (KR); Kyung Bae Park, Hwaseong-si (KR); Sung Young Yun, Suwon-si (KR); Gae Hwang Lee, Seongnam-si (KR); Seon-Jeong Lim, Yongin-si (KR); Yong Wan Jin, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/596,265

(22) Filed: Oct. 8, 2019

(65) Prior Publication Data
US 2020/0373356 A1    Nov. 26, 2020

(30) Foreign Application Priority Data

May 24, 2019  (KR) .................. 10-2019-0061479

(51) Int. Cl.
*H01L 27/30* (2006.01)
*H01L 51/42* (2006.01)
(Continued)

(52) U.S. Cl.
CPC ........ *H01L 27/305* (2013.01); *H01L 51/4253* (2013.01); *H04B 10/114* (2013.01);
(Continued)

(58) Field of Classification Search
CPC ........... H01L 27/1464; H01L 27/14612; H01L 27/14636; H01L 27/14621;
(Continued)

(56) References Cited

U.S. PATENT DOCUMENTS 6,300,612 B1   10/2001  Yu
7,650,082 B2 *  1/2010  Yamada ............. H04B 10/1141
                                                          398/198
(Continued)

FOREIGN PATENT DOCUMENTS

EP    3340492 A1 *  6/2018  ............. H04B 10/67
EP    3360269 A1     8/2018
(Continued)

OTHER PUBLICATIONS

Shekhar et al; Hybrid image sensor of small molecule organic photodiode on CMOS—Integration and characterization; nature search scientific reports; 2020; pp. 1-11. (Year: 2020).*
(Continued)

*Primary Examiner* — Amritbir K Sandhu
(74) *Attorney, Agent, or Firm* — Harness, Dickey & Pierce, P.L.C.

(57) ABSTRACT

An optical wireless communication system includes an optical wireless transmitter configured to emit a discrete-time signal of first light, second light, and third light having different wavelength spectra; and a light-receiving sensor including an optical wireless receiver including first, second, and third photoelectric conversion devices configured to convert discrete-time signals of the first, second, and third light beams into first, second, and third photoelectric conversion signals, respectively, wherein the second photoelectric conversion device at least partially overlaps the first photoelectric conversion device, and the third photoelectric conversion device at least partially overlaps at least one photoelectric conversion device of the first photoelectric conversion device or the second photoelectric conversion device, and at least one photoelectric conversion device of the first photoelectric conversion device, the second photoelectric conversion device, or the third photoelectric con-
(Continued)

version device includes an organic light absorbing material, a quantum dot, or a combination thereof.

23 Claims, 15 Drawing Sheets

(51) Int. Cl.
*H04B 10/114* (2013.01)
*H04B 10/66* (2013.01)
*H04B 10/50* (2013.01)
*H01L 51/00* (2006.01)

(52) U.S. Cl.
CPC ............. *H04B 10/50* (2013.01); *H04B 10/66* (2013.01); *H01L 51/0036* (2013.01); *H01L 51/0043* (2013.01); *H01L 51/0046* (2013.01); *H01L 51/0047* (2013.01); *H01L 51/0094* (2013.01)

(58) Field of Classification Search
CPC ......... H01L 27/14623; H01L 27/14645; H01L 25/167; H01L 27/1225; H01L 27/14627; H01L 27/14638; H01L 27/14641; H01L 27/14685; H01L 27/14689; H01L 27/307; H01L 29/2003; H01L 31/0203; H01L 31/167; H01L 43/08; H01L 43/10; H01L 21/4846; H01L 21/486; H01L 21/568; H01L 2224/16227; H01L 2224/18; H01L 2224/32225; H01L 2224/48091; H01L 2224/48227; H01L 2224/73265; H01L 2225/06517; H01L 2225/0652; H01L 2225/06568; H01L 2225/06572; H01L 2251/5338; H01L 23/3128; H01L 23/53209; H01L 23/5383; H01L 23/5384; H01L 23/5389; H01L 23/562; H01L 24/48; H01L 25/042; H01L 25/0657; H01L 25/50; H01L 27/1443; H01L 27/1446; H01L 27/14605; H01L 27/14609; H01L 27/14614; H01L 27/14618; H01L 27/1462; H01L 27/14634; H01L 27/14643; H01L 27/14647; H01L 27/14663; H01L 27/14687; H01L 27/1469; H01L 27/156; H01L 27/22; H01L 27/286; H01L 27/323; H01L 27/3262; H01L 27/3276; H01L 2924/00014; H01L 29/247; H01L 29/4175; H01L 29/454; H01L 29/778; H01L 29/7786; H01L 29/786; H01L 29/78693; H01L 29/84; H01L 31/02005; H01L 31/02162; H01L 31/024; H01L 31/035218; H01L 31/1013; H01L 31/112; H01L 31/1804; H01L 31/1876; H01L 33/0025; H01L 33/04; H01L 33/06; H01L 33/14; H01L 33/145; H01L 33/28; H01L 33/30; H01L 35/04; H01L 35/34; H01L 41/053; H01L 41/25; H01L 43/12; H01L 51/0097; H01L 51/448; H01L 51/4253; H01L 51/0094; H01L 51/0047; H01L 51/0046; H01L 51/0043; H01L 51/0036; H01L 27/302; H01L 51/0053; H01L 51/0072; H01L 27/1463; H01L 51/0061; H01L 27/305; H04B 10/114; H04B 10/66; H04B 10/50; Y02E 10/549
USPC ........ 398/115–117; 257/21, 53, 82, 88, 184, 257/431, 432, 461, 464
See application file for complete search history.

(56) References Cited

U.S. PATENT DOCUMENTS

| | | | |
|---|---|---|---|
| 8,212,141 B2 | 7/2012 | Miyata et al. | |
| 8,704,213 B2 | 4/2014 | Suzuki | |
| 8,716,952 B2 * | 5/2014 | Van de Ven | H05B 45/00 315/294 |
| 8,847,516 B2 * | 9/2014 | Chobot | H05B 45/48 315/307 |
| 9,184,198 B1 | 11/2015 | Miao et al. | |
| 9,276,676 B2 | 3/2016 | Yokoi | |
| 9,287,327 B2 * | 3/2016 | Lee | H04N 5/23229 |
| 9,577,012 B2 * | 2/2017 | Ooki | H01L 27/14627 |
| 9,906,298 B2 | 2/2018 | Togashi | |
| 10,135,528 B2 | 11/2018 | Tsonev et al. | |
| 2007/0008258 A1 * | 1/2007 | Yamamoto | H04B 10/116 345/83 |
| 2007/0058881 A1 * | 3/2007 | Nishimura | G06T 5/006 382/275 |
| 2008/0212981 A1 * | 9/2008 | Yamada | H04B 10/116 398/202 |
| 2009/0087189 A1 * | 4/2009 | Rollins | H04B 10/1141 398/140 |
| 2009/0229668 A1 * | 9/2009 | Kim | B82Y 10/00 136/263 |
| 2009/0324248 A1 * | 12/2009 | Shiraki | H04B 10/116 398/172 |
| 2010/0270589 A1 * | 10/2010 | Suh | H01L 31/1812 257/184 |
| 2012/0087676 A1 * | 4/2012 | Lim | H04B 10/116 398/182 |
| 2012/0147361 A1 * | 6/2012 | Mochizuki | H01S 5/4025 356/218 |
| 2012/0155889 A1 * | 6/2012 | Kim | H04B 10/116 398/193 |
| 2013/0038219 A1 * | 2/2013 | Dau | H05B 45/50 315/151 |
| 2016/0013248 A1 | 1/2016 | Sawaki | |
| 2016/0181547 A1 * | 6/2016 | Han | H01L 27/307 257/40 |
| 2016/0227194 A1 * | 8/2016 | Kim | H04N 13/25 |
| 2016/0308614 A1 | 10/2016 | Tsonev et al. | |
| 2016/0380032 A1 * | 12/2016 | Park | H01L 51/44 257/40 |
| 2017/0141143 A1 * | 5/2017 | Jin | H01L 27/146 |
| 2017/0171949 A1 * | 6/2017 | Kim | F21K 9/238 |
| 2018/0033769 A1 | 2/2018 | Wang | |
| 2018/0062112 A1 | 3/2018 | Heo et al. | |
| 2018/0375576 A1 * | 12/2018 | Stout | G01C 21/20 |
| 2019/0075281 A1 * | 3/2019 | Hall | G06F 3/0325 |
| 2019/0120689 A1 * | 4/2019 | Leem | H01L 27/1462 |
| 2019/0189696 A1 * | 6/2019 | Yamaguchi | H04N 5/379 |
| 2019/0245008 A1 * | 8/2019 | Lee | H01L 27/14667 |
| 2019/0319062 A1 * | 10/2019 | Lee | G02B 5/208 |
| 2019/0391073 A1 * | 12/2019 | Tanaka | G01N 21/3151 |
| 2020/0212108 A1 * | 7/2020 | Bando | H01L 51/4253 |
| 2020/0287661 A1 * | 9/2020 | Maierbacher | H03M 13/3761 |
| 2020/0296269 A1 * | 9/2020 | Leem | H01L 27/14647 |
| 2020/0373356 A1 * | 11/2020 | Park | H04B 10/50 |

FOREIGN PATENT DOCUMENTS

| | | |
|---|---|---|
| JP | 2003234460 A | 8/2003 |
| JP | 3881429 B2 | 2/2007 |
| JP | 5323025 B2 | 10/2013 |
| KR | 100927661 B1 | 11/2009 |
| KR | 101403847 B1 | 6/2014 |
| KR | 101610750 B1 | 4/2016 |
| KR | 20160104329 A | 9/2016 |
| KR | 10-2017-0066778 A | 6/2017 |
| KR | 20170133826 A | 12/2017 |
| KR | 10-2018-0024296 A | 3/2018 |
| KR | 10-2018-0104029 A | 9/2018 |

(56) References Cited

FOREIGN PATENT DOCUMENTS

WO    WO-2017-060200 A1    4/2017
WO    WO-2017-125719 A1    7/2017

OTHER PUBLICATIONS

Shekhar et al; Hybrid image sensor of small molecule organic photodiode on CMOS—Integration and characterization; 2020; Nature.com Scientific Reports; pp. 1-11. (Year: 2020).*

Shekhar et al; Hybrid image sensor of small molecule organic photodiode on CMOS—Integration and Characterization; 2020; Scientific reports; pp. 1-11. (Year: 2020).*

Arredondo et al., "Visible Light Communication System Using an Organic Heterojunction Photodetector" Sensors (2013), 13, 12266-12276.

* cited by examiner

OPTICAL WIRELESS COMMUNICATIONS SYSTEMS

CROSS-REFERENCE TO RELATED APPLICATION

This application claims priority to and the benefit of Korean Patent Application No. 10-2019-0061479 filed in the Korean Intellectual Property Office on May 24, 2019, the entire contents of which are incorporated herein by reference.

BACKGROUND

1. Field

Optical wireless communication systems that may use light in various wavelength regions, also referred to herein as various wavelength spectra, are disclosed.

2. Description of the Related Art

Recently, an interest in optical wireless communication technology complementarily used with Radio Frequency (RF) technology has been increased due to popularization of Light Emitting Diode (LED) lighting as an environmentally-friendly lighting equipment, frequency depletion of a RF band, increased risk of cross-talk among several wireless communication technologies, increasing requirements for communication security, an ultrahigh speed ubiquitous communication environment of 4G wireless technology, and the like, and accordingly, research on optical wireless communication using light-emitting equipment, for example, visible light LEDs and the like, is actively being made.

Optical wireless communication systems are represented by Wi-Fi (wireless-fidelity), Blue Tooth, and the like and use electromagnetic wave wavelength spectra that include visible and infrared light wavelength spectra (about 400 nm to about 4000 nm) unlike a RF communication system using radio frequencies of the RF band (an electromagnetic wave wavelength spectrum of about 1 mm to about 100 km). Such optical communication may not only be safe and freely use a wide wavelength spectrum without restriction but also, when visible light is used, since a destination that light reaches and a direction that the light proceeds can be visibly observed ("seen"), there is a merit of precisely knowing an information-receiving range. Accordingly, the optical communication may be trustworthy in terms of security and operated with a low voltage in terms of power consumption.

In addition, the optical communication has a small influence on a human body or precision machinery and thus may be used in hospitals and aircraft where RF is restricted. Since optical communication technology has these various merits, a demand on optical communication systems that may provide data transmission with high speed/high efficiency as well as reducing or minimizing the number and size of additional equipment is being continuously made.

SUMMARY

Optical wireless communication systems capable of high speed/high efficiency data transmission are provided.

According to some example embodiments, an optical wireless communication system may include an optical wireless transmitter and an optical wireless receiver. The optical wireless transmitter may be configured to emit a discrete-time signal of a first light beam, a discrete-time signal of a second light beam, and a discrete-time signal of a third light beam, the first, second, and third light beams having different wavelength spectra. The optical wireless receiver may include a first photoelectric conversion device configured to convert the discrete-time signal of the first light beam into a first photoelectric conversion signal, a second photoelectric conversion device configured to convert the discrete-time signal of the second light beam into a second photoelectric conversion signal, and a third photoelectric conversion device configured to convert the discrete-time signal of the third light beam into a third photoelectric conversion signal. The second photoelectric conversion device may extend at least partially in parallel with the first photoelectric conversion device in a first direction and may at least partially overlap the first photoelectric conversion device in a second direction that is perpendicular to the first direction. The third photoelectric conversion device may extend at least partially in parallel with both the first and second photoelectric conversion devices in the first direction and may at least partially overlap at least one photoelectric conversion device of the first photoelectric conversion device or the second photoelectric conversion device in the second direction. At least one photoelectric conversion device of the first photoelectric conversion device, the second photoelectric conversion device, or the third photoelectric conversion device may include an organic light absorbing material, a quantum dot, or a combination thereof.

The optical wireless transmitter may include a white light source configured to emit a white light beam including at least the first light beam, the second light beam, and the third light beam.

The optical wireless transmitter may include a first light source configured to emit the discrete-time signal of the first light beam, a second light source configured to emit the discrete-time signal of the second light beam, and a third light source configured to emit the discrete-time signal of the third light beam.

The third photoelectric conversion device may at least partially overlap the first photoelectric conversion device in the second direction, and the third photoelectric conversion device may be distal to an incident light side of the optical wireless receiver in relation to the first photoelectric conversion device.

All of the first photoelectric conversion device, the second photoelectric conversion device, and the third photoelectric conversion device may at least partially overlap each other in the second direction, and the first photoelectric conversion device and the second photoelectric conversion device may be distal to an incident light side of the optical wireless receiver in relation to the third photoelectric conversion device.

The optical wireless receiver may further include a fourth photoelectric conversion device that is distal to an incident light side of the optical wireless receiver in relation to both the first photoelectric conversion device and the second photoelectric conversion device, and configured to selectively absorb a discrete-time signal of light in an infrared wavelength spectrum.

The optical wireless transmitter may include at least one of a fourth light source configured to emit an infrared light beam, or a white light source configured to emit a white light beam including infrared light.

The fourth photoelectric conversion device may include a quantum dot, a quinoid metal complex compound, a polymethine compound, a cyanine compound, a phthalocyanine compound, a merocyanine compound, a naphthalocyanine compound, an immonium compound, a diimmonium compound, a triarylmethane compound, a dipyrromethene compound, an anthraquinone compound, naphthoquinone, a diquinone compound, a naphthoquinone compound, an anthraquinone compound, a squarylium compound, a rylene compound, a perylene compound, a squaraine compound, a pyrylium compound, a squaraine compound, a thiopyrylium compound, a diketopyrrolopyrrole compound, a boron dipyrromethene compound, a nickel-dithiol complex compound, a croconium compound, a derivative thereof, or a combination thereof.

The first light beam may be a green light beam, the second light beam may be a blue light beam, and the third light beam may be a red light beam.

The organic light absorbing material may include at least one of a compound represented by Chemical Formula 1, fullerene, or a fullerene derivative:

EDG-HA-EAG                                    [Chemical Formula 1]

wherein, in Chemical Formula 1, HA is a C2 to C30 heterocyclic group having at least one of S, Se, Te, or Si, EDG is an electron-donating group, and EAG is an electron accepting group.

The quantum dot may include an alkaline metal-Group VI compound, a Group II-Group VI compound, a Group IV-Group VI compound, a Group III-Group V compound, a Group IV element or compound, graphene, or a combination thereof.

At least one photoelectric conversion device of the first photoelectric conversion device, the second photoelectric conversion device, or the third photoelectric conversion device may include a p-type semiconductor and an n-type semiconductor, and the p-type semiconductor and the n-type semiconductor of the at least one photoelectric conversion device may form a pn junction.

The at least one photoelectric conversion device may include an intrinsic layer (I layer) in which the p-type semiconductor and the n-type semiconductor are mixed in a bulk heterojunction form.

The at least one photoelectric conversion device may further include a p-type layer and/or n-type layer in direct contact with the intrinsic layer.

A volume ratio of the p-type semiconductor and the n-type semiconductor in the intrinsic layer may be about 9:1 to about 1:9.

A difference between a maximum absorption wavelength ($\lambda_{max2}$) of the second photoelectric conversion device and a maximum absorption wavelength ($\lambda_{max1}$) of the first photoelectric conversion device may range from about 30 nm to about 200 nm. A difference between a maximum absorption wavelength ($\lambda_{max1}$) of the first photoelectric conversion device and a maximum absorption wavelength ($\lambda_{max3}$) of the third photoelectric conversion device may range from about 30 nm to about 200 nm.

Each photoelectric conversion device of the first photoelectric conversion device, the second photoelectric conversion device, and the third photoelectric conversion device may have a light-receiving area of about 0.1 pmt to about 100 $mm^2$.

Each photoelectric conversion device of the first photoelectric conversion device, the second photoelectric conversion device, and the third photoelectric conversion device may include a first electrode and a second electrode facing each other and a photoelectric conversion layer between the first electrode and the second electrode.

Each of the first electrode, the second electrode, and the photoelectric conversion layer may have a thickness of about 5 nm to about 1100 nm.

The optical wireless receiver may further include a data processor configured to processes each photoelectric conversion signal of the first photoelectric conversion signal, the second photoelectric conversion signal, and the third photoelectric conversion signal as noise, except for a photoelectric conversion signal having a greatest intensity of the first photoelectric conversion signal, the second photoelectric conversion signal, and the third photoelectric conversion signal, with reference to light in a particular wavelength spectrum belonging to visible and infrared wavelength spectra.

According to some example embodiments, an optical wireless receiver may include a plurality of photoelectric conversion devices configured to convert separate, respective discrete-time signals of a plurality of light beams into separate, respective photoelectric conversion signals, the plurality of light beams having different wavelength spectra. At least two photoelectric conversion devices of the plurality of photoelectric conversion devices may extend at least partially in parallel in a first direction and at least partially overlap each other in a second direction that is perpendicular to the first direction. At least one photoelectric conversion device of the plurality of photoelectric conversion devices may include an organic light absorbing material, a quantum dot, or a combination thereof.

The discrete-time signals of the plurality of light beams may include a discrete-time signal of a first light beam, a discrete-time signal of a second light beam, and a discrete-time signal of a third light beam. The plurality of photoelectric conversion devices may include a first photoelectric conversion device configured to convert the discrete-time signal of the first light beam into a first photoelectric conversion signal, a second photoelectric conversion device configured to convert the discrete-time signal of the second light beam into a second photoelectric conversion signal, and a third photoelectric conversion device configured to convert the discrete-time signal of the third light beam into a third photoelectric conversion signal. The second photoelectric conversion device may extend at least partially in parallel with the first photoelectric conversion device in the first direction and at least partially overlap the first photoelectric conversion device in the second direction. The third photoelectric conversion device may extend at least partially in parallel with both the first and second photoelectric conversion devices in the first direction and at least partially overlap at least one photoelectric conversion device of the first photoelectric conversion device or the second photoelectric conversion device in the second direction.

The third photoelectric conversion device may at least partially overlap the first photoelectric conversion device in the second direction. The third photoelectric conversion device may be distal to an incident light side of the optical wireless receiver in relation to the first photoelectric conversion device.

All of the first photoelectric conversion device, the second photoelectric conversion device, and the third photoelectric conversion device may at least partially overlap each other in the second direction. The first photoelectric conversion device and the second photoelectric conversion device may be distal to an incident light side of the optical wireless receiver in relation to the third photoelectric conversion device.

At least one photoelectric conversion device of the plurality of photoelectric conversion devices may be configured to convert a discrete-time signal of a light beam belonging to an infrared wavelength spectrum into a particular photoelectric conversion signal, or convert a discrete-time signal of a light beam belonging to an ultraviolet wavelength spectrum into a particular photoelectric conversion signal.

DETAILED DESCRIPTION

Figure 1:
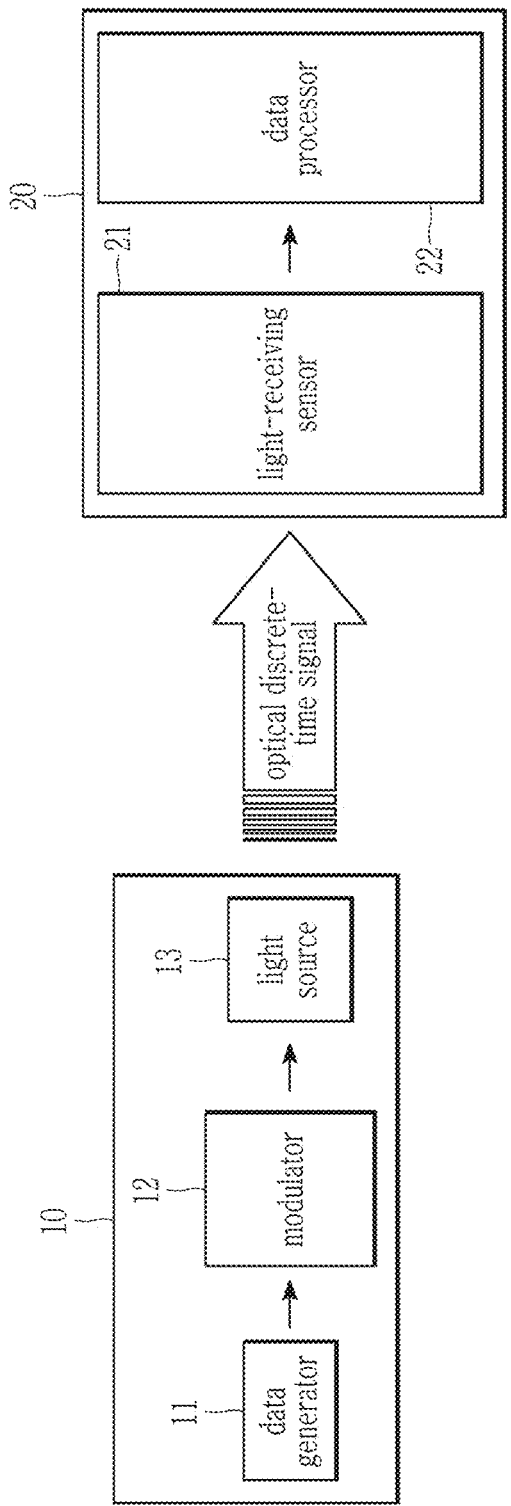
FIG. 1 is a block diagram of an optical wireless communication system according to some example embodiments.

Hereinafter, example embodiments of the present inventive concepts will be described in detail so that a person skilled in the art would understand the same. This disclosure may, however, be embodied in many different forms and is not construed as limited to the example embodiments set forth herein.

In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Additionally, an element that is "on" another element may be "above" or "beneath" the other element.

As used herein, when a definition is not otherwise provided, "substituted" may refer to replacement of a hydrogen atom of a compound by a substituent selected from a halogen atom, a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, phosphoric acid or a salt thereof, silyl group, a C1 to C20 alkyl group, a C2 to C20 alkenyl group, a C2 to C20 alkynyl group, a C6 to C30 aryl group, a C7 to C30 arylalkyl group, a C1 to C30 alkoxy group, a C1 to C20 heteroalkyl group, a C3 to C20 heteroaryl group, a C3 to C20 heteroarylalkyl group, a C3 to C30 cycloalkyl group, a C3 to C15 cycloalkenyl group, a C6 to C15 cycloalkynyl group, a C3 to C30 heterocycloalkyl group, and a combination thereof.

As used herein, when a definition is not otherwise provided, "hetero" may refer to one including 1 to 4 heteroatoms selected from N, O, S, Se, Te, Si, and P.

Hereinafter, "combination" may refer to a mixing and a stack structure of two or more.

Hereinafter, an optical wireless communication system according to some example embodiments is described.

FIG. 1 is a block diagram of an optical wireless communication system according to some example embodiments.

Referring to FIG. 1, an optical wireless communication system according to some example embodiments includes an optical wireless transmitter 10 and an optical wireless receiver 20. The optical wireless transmitter 10 may be configured to emit discrete-time signals of multiple light beams that have different wavelength spectra. The optical wireless transmitter 10 may modulate and emit particular (or, alternatively, predetermined) light beams corresponding to a particular (or, alternatively, predetermined) visible to infrared wavelength spectrum into a form of a discrete-time signal, and the optical wireless receiver 20 may receive the emitted one or more light beams in the form of the discrete-time signal and converts the received discrete-time signal into a photoelectric conversion signal.

First, an optical wireless transmitter 10 according to some example embodiments includes a data generator 11, a modulator 12, and a light source 13.

The data generator 11 may output ("transmit") data to be transmitted through optical wireless communication. Data output from the data generator 11 is input to the modulator 12.

The modulator 12 may modulate the signal received from the data generator 11 into a signal for optical communication. Examples of a data modulation type of the modulator 12 may include an OOK (On-Off Keying) modulation, a variable pulse position modulation (VPPM), a CSK (Color Shift Keying) modulation, an ASK (Amplitude Shift Keying) modulation, and the like.

The data generator 11 and the modulator 12 may each be included in, may include, and/or may be implemented by, one or more instances of processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. In some example embodiments, the processing circuitry may include a non-transitory computer readable storage device, for example a solid state drive (SSD), storing a program of instructions, and a processor configured to execute the program of instructions to implement the functionality of the data generator 11 and/or the modulator 12.

The OOK (On-Off Keying) modulation is a simple modulation type expressed by turning the light source 13 "ON (switched on)" and "OFF (switched off)."

Herein, "OFF" is not to completely remove light of the light source 13 but to classify a quantity of light into a level of being recognized as "ON" and another level of being recognized as "OFF."

The VPPM (Variable Pulse Position Modulation) type is to combine PPM (Pulse Position Modulation) and PWM (Pulse Width Modulation) and distinguish signals by changing how long the light source 13 is turned on ("emits light") or when the light source 13 is turned on. The VPPM type may not only block generation of flickers inside a transmitted data frame and control brightness of the light source 13 but also provide a data modulation function for a wireless communication.

The CSK (Color Shift Keying) modulation is to increase a transmission speed by changing each brightness ratio of R, G, and B channels of red, green, and blue light emitted by the light source 13 and thus distinguishing symbols thereof.

The ASK (Amplitude Shift Keying) modulation is a digital modulation type using a band-pass modulation of corresponding a different carrier wave amplitude depending on a digital symbol signal and may be used with the OOK modulation during the wireless optical communication data modulation.

The modulator 12 may be equipped depending on the aforementioned data modulation types, a type and/or the number ("quantity") of the light source 13, and the like but is not limited thereto.

In some example embodiments, the light source 13 may emit one or more light beams, each belonging to a particular visible to infrared wavelength spectrum. The light source 13 may be operated depending on data modulated by the above modulator 12 and thus may convert one or more light beams in the above particular (or, alternatively, predetermined) wavelength spectrum into an optical discrete-time signal of the one or more light beams in a particular (or, alternatively, predetermined) wavelength spectrum and then, emit the discrete-time signal of the one or more light beams.

In some example embodiments, the light source 13 may include a plurality of light sources configured to emit a plurality of light beams having different wavelength spectra in relation to each another, but the light source 13 may, in some example embodiments, use one light source configured to emit light beams having different wavelength spectra in relation to each another.

FIGS. 2, 3, 4, and 5 are block diagrams showing various examples of the optical wireless communication system of FIG. 1.

Figure 2:
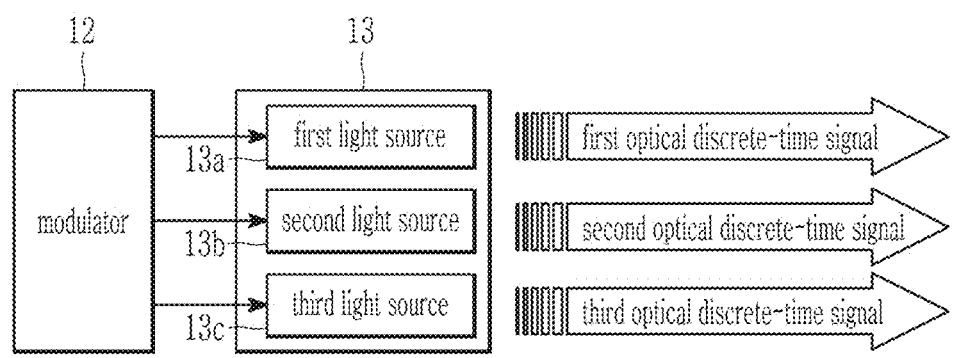
FIGS. 2, 3, 4, and 5 are block diagrams showing various examples of the optical wireless communication system of FIG. 1.

Referring to FIG. 2, in some example embodiments, the light source 13 may include a first light source 13a configured to emit a discrete-time signal of a first light beam, a second light source 13b configured to emit a discrete-time signal of a second light beam, and a third light source 13c configured to emit a discrete-time signal of a third light beam.

The first light beam, the second light beam, and the third light beam are different light beams having different wavelength spectra. In some example embodiments, the first light beam to the third light beam may belong to a visible wavelength region. For example, the first light beam may be a green light beam, the second light beam may be a red light beam, and the third light beam may be a blue light beam.

However, some example embodiments are not necessarily limited thereto. The first light beam to the third light beam may be any light beam belonging to any portion of the visible wavelength spectrum without a particular limit and may be, for example, selected from magenta, yellow, cyan, and the like besides the aforementioned green, red, blue.

The first light source 13a, the second light source 13b, and the third light source 13c may respectively receive the modulated data through the modulator 12, respectively be operated separately, and emit different optical discrete-time signals in relation to one another regarding the first light beam, the second light beam, and the third light beam. For example, the optical discrete-time signal of the first light beam may be emitted later or faster than the discrete-time signal of the second light beam or the third light beam, and in addition, intensity thereof may be stronger or weaker (e.g., the first to third light beams may have different intensities).

Figure 3:
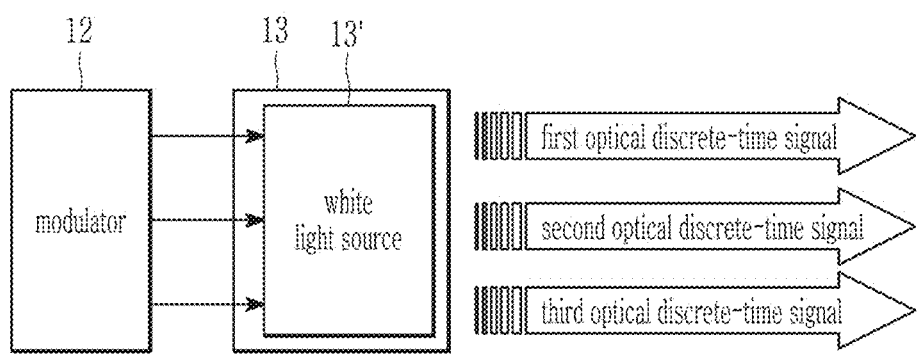

Referring to FIG. 3, the light source 13 may include a white light source 13' wherein the first light beam, the second light beam, and the third light beam is mixed-colored. The white light source 13' may receive the modulated data through the modulator 12 and emit optical discrete-time signals of a first light component, a second light component, and a third light component in white light. Restated, the white light source 13' may be configured to emit a white light beam that includes the aforementioned first light beam, the aforementioned second light beam, and the aforementioned third light beam, and thus the white light source 13' may be configured to emit a white light beam that includes the optical discrete-time signals of the first, second, and third light beams. In some example embodiments, the white light source 13' may emit a white light beam that includes infrared light, thereby including a fourth light beam belonging to an infrared wavelength spectrum as described below with reference to fourth light source 13d.

Figure 4:
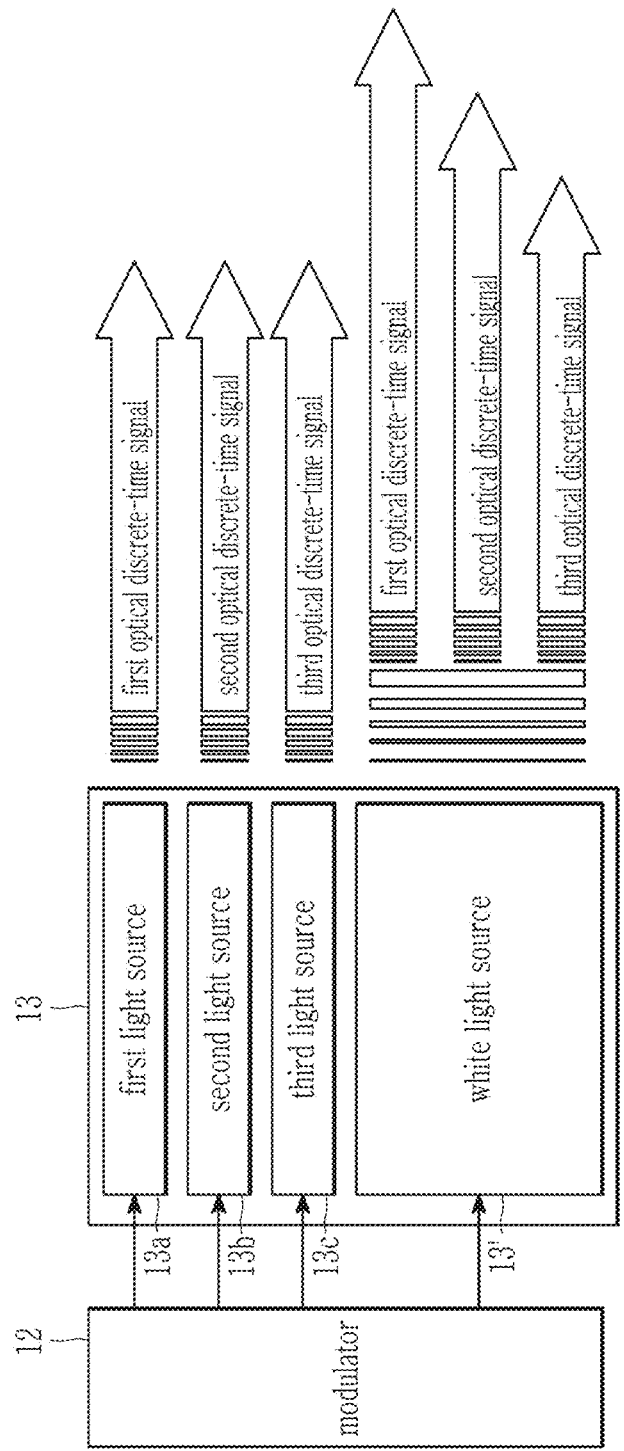

Referring to FIG. 4, the light source 13 may all include the first light source 13a, the second light source 13b, the third light source 13c, and the white light source 13' illustrated in FIGS. 2 to 3. The first light source 13a, the second light source 13b, the third light source 13c, and the white light source 13' respectively receive the modulated data through the modulator 12, respectively is operated separately, and individually emit different optical discrete-time signals.

Referring to FIG. 4, the first to third light discrete-time signals emitted from the white light source 13' and the first to third light discrete-time signals emitted from the first light source 13a, the second light source 13b, and the third light source 13c may be the same or different depending on the data modulation types of the modulator 12.

Figure 5:
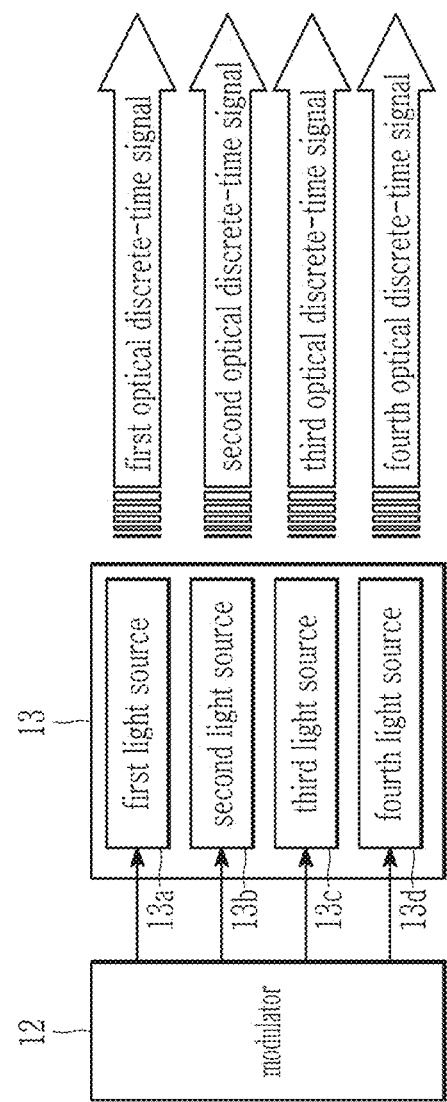

Referring to FIG. 5, the light source 13 may further include a fourth light source 13d in addition to the first light source 13a, the second light source 13b, and the third light source 13c illustrated in FIG. 2. In some example embodiments, the fourth light source 13d may receive the modulated data through the modulator 12 and thus emit a discrete-time signal of a fourth light beam differing from the first light beam to the third light beam.

In some example embodiments, the fourth light source 13d may emit a light beam belonging to ("having") an infrared wavelength spectrum (e.g., an infrared light beam), for example, a light beam belonging to a near infrared light wavelength spectrum ranging from about 720 nm to about 1500 nm, a light beam belonging to a medium-Infrared wavelength spectrum of about 1500 nm to about 4000 nm, or a combination thereof. In some example embodiments, the fourth light source 13d may emit a light beam belonging to ("having") an ultraviolet wavelength spectrum (e.g., an ultraviolet light beam).

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

Referring to FIG. 5, since an optical discrete-time signal of a visible wavelength spectrum is emitted with an optical discrete-time signal of an infrared wavelength spectrum together, an information transmission type of the optical wireless communication system may be extended.

In some example embodiments, an instance of lighting equipment usable for the light source 13 is not particularly limited but may include a publicly-known light emitting diode (LED), a semiconductor laser diode (LD), and the like.

In some example embodiments, the optical wireless receiver 20 includes a light-receiving sensor 21 and a data processor 22. The light-receiving sensor 21 may include a photoelectric conversion device 100 that receives an optical discrete-time signal transmitted from the aforementioned optical wireless transmitter 10 and converts it into a photoelectric conversion signal.

The data processor 22 may be included in, may include, and/or may be implemented by, one or more instances of processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. In some example embodiments, the processing circuitry may include a non-transitory computer readable storage device, for example a solid state drive (SSD), storing a program of instructions, and a processor configured to execute the program of instructions to implement the functionality of the data processor 22.

In some example embodiments, the optical wireless receiver 20 may detect discrete-time signals of the first, second, and third light beams emitted through at least a first light source 13a, a second light source 13b, a third light source 13c, and/or a white light source 13', and thus the optical wireless receiver 20 may include a photoelectric conversion device 100 that may include a first photoelectric conversion device 100a configured to convert the discrete-time signal of the first light beam into a first photoelectric conversion signal, a second photoelectric conversion device 100b configured to convert the discrete-time signal of the second light beam into a second photoelectric conversion signal, and a third photoelectric conversion device 100c configured to convert the discrete-time signal of the third light beam to a third photoelectric conversion signal.

In some example embodiments, the photoelectric conversion device 100 may include the aforementioned first photoelectric conversion device 100a, second photoelectric conversion device 100b, and third photoelectric conversion device 100c, and each of maximum absorption wavelengths ($\lambda_{max}$) of the first photoelectric conversion device 100a, second photoelectric conversion device 100b, and third photoelectric conversion device 100c has an interval within a particular (or, alternatively, predetermined) range so that optical discrete-time signals of particular (or, alternatively, predetermined) wavelength spectra may be received in each photoelectric conversion device.

The interval relationships between maximum absorption wavelengths ($\lambda_{max}$) of the first photoelectric conversion device 100a, the second photoelectric conversion device 100b, and the third photoelectric conversion device 100c may be different according to contents and types of organic light absorbing materials and/or quantum dots. However, for example a difference between a maximum absorption wavelength ($\lambda_{max2}$) of the second photoelectric conversion device 100b and a maximum absorption wavelength ($\lambda_{max1}$) of the first photoelectric conversion device 100a may range from about 30 nm to about 200 nm, and a difference between a maximum absorption wavelength ($\lambda_{max1}$) of the first photoelectric conversion device 100a and a maximum absorption wavelength ($\lambda_{max3}$) of the third photoelectric conversion device 100c may range from about 30 nm to about 200 nm.

In some example embodiments, the optical wireless receiver 20 may further detect a discrete-time signal of a fourth light beam in an infrared wavelength spectrum in addition to the light beams emitted by the aforementioned first light source 13a, second light source 13b, third light source 13c and/or white light source 13', and thus the photoelectric conversion device 100 may further include a fourth photoelectric conversion device 100d configured to convert the discrete-time signal of the fourth light beam to a photoelectric conversion signal, in addition to the first photoelectric conversion device 100a, the second photoelectric conversion device 100b, and the third photoelectric conversion device 100c.

Detailed arrangement relationships of the first to third photoelectric conversion devices 100a, 100b, 100c, and 100d and the first to fourth photoelectric conversion devices 100a, 100b, 100c, and 100d will be described later.

In some example embodiments, the photoelectric conversion device 100 (e.g., one or more of the first, second, third, or fourth photoelectric conversion devices 100a, 100b, 100c, or 100d) may include an organic light absorbing material, a quantum dot, or a combination thereof. Specifically, at least one photoelectric conversion device of the first photoelectric conversion device 100a, the second photoelectric conversion device 100b, the third photoelectric conversion device 100c, or the fourth photoelectric conversion device 100d may include an organic light absorbing material, a quantum dot, or a combination thereof.

According to some example embodiments, at least two of the first photoelectric conversion device 100a, the second photoelectric conversion device 100b, or the third photoelectric conversion device 100c may include an organic light absorbing material, a quantum dot, or a combination thereof. For example, each of the first photoelectric conversion device 100a, the second photoelectric conversion device 100b, and the third photoelectric conversion device 100c may include an organic light absorbing material, a quantum dot, or a combination thereof.

However, some example embodiments are not necessarily limited thereto. For example, one of the first photoelectric conversion device 100a, the second photoelectric conversion device 100b, or the third photoelectric conversion device 100c may be a photodiode including silicon, germanium, or a combination thereof.

As is described herein, a photoelectric conversion device 100 may include one or more photoelectric conversion devices of a first photoelectric conversion device 100a, a second photoelectric conversion device 100b, a third photoelectric conversion device 100c, or a fourth photoelectric conversion device 100d. Accordingly, various properties, materials, structures, or the like that are described herein with reference to the photoelectric conversion device 100 will be understood to refer to one or more, or all, of a first photoelectric conversion device 100a, a second photoelectric conversion device 100b, a third photoelectric conversion device 100c, or a fourth photoelectric conversion device 100d included in the photoelectric conversion device 100.

In some example embodiments, in the case that the photoelectric conversion device 100 includes an organic light absorbing material, a quantum dot, or a combination thereof, the photoelectric conversion device 100 may include a first electrode 120 and a second electrode 130 facing each other, and a photoelectric conversion layer 110 disposed between the first electrode 120 and the second electrode 130. The first to fourth photoelectric conversion devices 100a, 100b, 100c, and 100d may each include a separate first electrode 120a, 120b, 120c, and 120d, a separate second electrode 130a, 130b, 130c, and 130d, and a separate photoelectric conversion layer 110a, 110b, 110c, and 110d. Accordingly, it will be understood that any description herein with regard to a photoelectric conversion layer 110 may apply to any of the first to fourth photoelectric conversion layers 110a to 110d, any description herein with regard to a first electrode 120 may apply to any of the first electrodes 120a to 120d, and any description herein with regard to a second electrode 130 may apply to any of the second electrodes 130a to 130d.

A substrate (not shown) may be disposed at the side of the first electrode 120 or the second electrode 130. The substrate may be for example made of (e.g., may at least partially comprise) an inorganic material such as glass, an organic material such as polycarbonate, polymethylmethacrylate, polyethylene terephthalate, polyethylene naphthalate, polyamide, polyethersulfone, or a combination thereof, or a silicon wafer. The substrate may be omitted in some example embodiments.

One of the first electrode 120 or the second electrode 130 is an anode and the other is a cathode. For example, the first electrode 120 may be a cathode and the second electrode 130 may be an anode.

At least one of the first electrode 120 or the second electrode 130 may be a transparent electrode. Herein, the transparent electrode may be a transparent electrode having a high visible and infrared transmittance of greater than or equal to about 80% and may not include for example a semi-transparent electrode for microcavity.

The transparent electrode may include, for example, at least one of an oxide conductor or a carbon conductor. The oxide conductor may include for example at least one of indium tin oxide (ITO), indium zinc oxide (IZO), zinc tin oxide (ZTO), aluminum tin oxide (AlTO), or aluminum zinc oxide (AZO), and the carbon conductor may at least one of graphene or carbon nanostructure.

One of the first electrode 120 or the second electrode 130 may be a reflective electrode. Here, the reflective electrode may be, for example, a reflective electrode having visible and infrared transmittance of less than about 10% or high reflectance of less than or equal to about 5%. The reflective electrode may include a reflective conductor such as a metal and may include, for example aluminum (Al), silver (Ag), gold (Au), or an alloy thereof.

For example, the first electrode 120 may be a transparent electrode having visible and infrared transmittance of greater than or equal to about 80% or a reflective electrode having visible and infrared transmittance of less than about 10%.

The photoelectric conversion layer 110 may absorb ("detect") incident light in at least a portion of a wavelength spectrum in visible and infrared wavelength spectra and may convert the absorbed ("detected") light into a photoelectric conversion signal, for example a portion of light in a green wavelength spectrum, light in a blue wavelength spectrum, light in a red wavelength spectrum, light in an infrared wavelength spectrum, and/or light in an ultraviolet wavelength spectrum into a photoelectric conversion signal.

For example, the photoelectric conversion layer 110 may be configured to selectively absorb one of a green light beam, a blue light beam, a red light beam, an infrared light beam, or an ultraviolet light beam. Herein, the selective absorption of one of the green light beam, the blue light beam, the red light beam, the infrared light beam, and/or the ultraviolet beam means that a light-absorption spectrum has a peak absorption wavelength ($\lambda_{max}$) in one of about 500 nm to about 600 nm, greater than or equal to about 380 nm and less than about 500 nm, greater than about 600 nm and less than or equal to about 700 nm, and greater than about 700 nm, and a light-absorption spectrum in the corresponding wavelength spectrum is remarkably higher than those in the other wavelength spectra.

The photoelectric conversion layer 110 (e.g., at least one of the photoelectric conversion layer 110a, the photoelectric conversion layer 110b, the photoelectric conversion layer 110c, or the photoelectric conversion layer 110d as described herein) may include at least one p-type semiconductor and at least one n-type semiconductor which form a pn junction and may produce excitons by receiving light from outside and then separate the produced excitons into holes and electrons.

The p-type semiconductor and the n-type semiconductor may be each independently light absorbing materials, and for example at least one of the p-type semiconductor or the n-type semiconductor may be an organic light absorbing material, a quantum dot, or a combination thereof. For example, at least one of the p-type semiconductor or the n-type semiconductor may be a wavelength-selective light absorbing material that selectively absorbs light in a particular (or, alternatively, predetermined) wavelength region, and for example at least one of the p-type semiconductor or the n-type semiconductor may be a wavelength-selective organic light absorbing material, a quantum dot, or a combination thereof. The p-type semiconductor and the n-type semiconductor may have a peak absorption wavelength ($\lambda_{max}$) in the same wavelength spectrum or in a different wavelength region.

For example, the p-type semiconductor may be an organic light absorbing material having a core structure including an electron donating moiety, a pi conjugation linking group, and an electron accepting moiety. The organic light absorbing material that may be used as the p-type semiconductor may be for example represented by Chemical Formula 1.

EDG-HA-EAG [Chemical Formula 1]

In Chemical Formula 1,

HA may be a C2 to C30 heterocyclic group having at least one of S, Se, Te, or Si, EDG may be an electron-donating group, and EAG may be an electron accepting group.

Accordingly, it will be understood that the organic light absorbing material of at least one photoelectric conversion device of the optical wireless receiver 20 may include at least one of the compound represented by Chemical Formula 1, fullerene, or a fullerene derivative.

For example, the p-type semiconductor represented by Chemical Formula 1 may be for example represented by Chemical Formula 1A.

[Chemical Formula 1A]

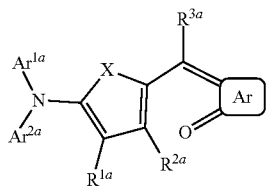

[Chemical Formula 1B]

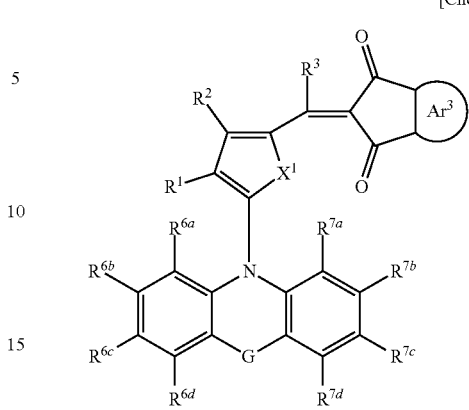

In Chemical Formula 1A,

X may be S, Se, Te, SO, $SO_2$, or $SiR^aR^b$,

Ar may be a substituted or unsubstituted C6 to C30 arylene group, a substituted or unsubstituted C3 to C30 heterocyclic group, or a fused ring of the foregoing two or more, $Ar^{1a}$ and $Ar^{2a}$ may each independently be a substituted or unsubstituted C6 to C30 aryl group or a substituted or unsubstituted C3 to C30 heteroaryl group, $Ar^{1a}$ and $Ar^{2a}$ may each independently be present alone or may be linked with each other to form a fused ring, and $R^{1a}$ to $R^{3a}$, $R^a$, and $R^b$ may each independently be hydrogen, deuterium, a substituted or unsubstituted C1 to C30 alkyl group, a substituted or unsubstituted C6 to C30 aryl group, a substituted or unsubstituted C3 to C30 heteroaryl group, a substituted or unsubstituted C1 to C6 alkoxy group, a halogen, or a cyano group.

For example, in Chemical Formula 1A, $Ar^{1a}$ and $Ar^2a$ may each independently be one of a substituted or unsubstituted phenyl group, a substituted or unsubstituted naphthyl group, a substituted or unsubstituted anthracenyl group, a substituted or unsubstituted phenanthrenyl group, a substituted or unsubstituted pyridinyl group, a substituted or unsubstituted pyridazinyl group, a substituted or unsubstituted pyrimidinyl group, a substituted or unsubstituted pyrazinyl group, a substituted or unsubstituted quinolinyl group, a substituted or unsubstituted isoquinolinyl group, a substituted or unsubstituted naphthyridinyl group, a substituted or unsubstituted cinnolinyl group, a substituted or unsubstituted quinazolinyl group, a substituted or unsubstituted phthalazinyl group, a substituted or unsubstituted benzotriazinyl group, a substituted or unsubstituted pyridopyrazinyl group, a substituted or unsubstituted pyridopyrimidinyl group, or a substituted or unsubstituted pyridopyridazinyl group.

For example, $Ar^{1a}$ and $Ar^{2a}$ of Chemical Formula 1A may be linked with each other to form a ring or for example, $Ar^{1a}$ and $Ar^2a$ may be linked with each other by one of a single bond, $-(CR^gR^h)_{n2}-$ (n2 is 1 or 2), $-O-$, $-S-$, $-Se-$, $-N=$, $-NR^i-$, $-SiR^jR^k-$, or $-GeR^lR^m-$ to form a ring. Herein, $R^g$ to $R^m$ may each independently be hydrogen, a substituted or unsubstituted C1 to C30 alkyl group, a substituted or unsubstituted C6 to C30 aryl group, a substituted or unsubstituted C3 to C30 heteroaryl group, a substituted or unsubstituted C1 to C6 alkoxy group, a halogen, or a cyano group.

For example, the organic light absorbing material represented by Chemical Formula 1 may be for example represented by Chemical Formula 1B.

In Chemical Formula 1B, $X^1$ may be Se, Te, O, S, SO, or $SO_2$,

Ara may be a substituted or unsubstituted C6 to C30 arylene group, a substituted or unsubstituted C3 to C30 heterocyclic group, or a fused ring of the foregoing two or more, $R^1$ to $R^3$ may each independently be one of hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heteroaryl group, a halogen, a cyano group, a cyano-containing group, or a combination thereof, G may be one of a single bond, $-O-$, $-S-$, $-Se-$, $-N=$, $-(CR^fR^g)_k-$, $-NR^h-$, $-SiR^iR^j-$, $-GeR^kR^l-$, $-(C(R^m)=C(R^n))-$, or $SnR^oR^p$, wherein $R^f$, $R^g$, $R^h$, $R^i$, $R^j$, $R^k$, $R^l$, $R^m$, $R^n$, $R^o$, and $R^p$ may independently be one of hydrogen, a halogen, a substituted or unsubstituted C1 to C10 alkyl group, a substituted or unsubstituted C1 to C10 alkoxy group, or a substituted or unsubstituted C6 to C12 aryl group, $R^f$ and $R^g$, $R^i$ and $R^j$, $R^k$ and $R^l$, $R^m$ and $R^n$, and $R^o$ and $R^p$ may independently be present alone or may be linked with each other to provide a ring, and k may be 1 or 2, $R^{6a}$ to $R^{6d}$ and $R^{7a}$ to $R^{7d}$ may independently be one of hydrogen, a substituted or unsubstituted C1 to C30 alkyl group, a substituted or unsubstituted C6 to C30 aryl group, a substituted or unsubstituted C3 to C30 heteroaryl group, a halogen, a cyano group, a cyano-containing group, or a combination thereof, $R^{6a}$ to $R^{6d}$ may each independently be present alone or adjacent two thereof may be linked with each other to form a fused ring, and $R^{7a}$ to $R^{7d}$ may each independently be present alone or adjacent two thereof may be linked with each other to form a fused ring.

For example, Ara of Chemical Formula 1B may be benzene, naphthylene, anthracene, thiophene, selenophene, tellurophene, pyridine, pyrimidine, or a fused ring of the foregoing two or more.

However, the organic light absorbing material that may be used as a p-type semiconductor is not limited to the above. For example, it may be a phthalocyanine-based, naphthoquinone-based, phthalocyanine-based, pyrrole-based, polymer condensation azo-based, anthraquinone-based, cyanine-based, or polythiophene-based compound, or a combination thereof.

The organic light absorbing material that may be used as an n-type semiconductor may be for example fullerene or a fullerene derivative, but is not limited thereto.

For example, the quantum dot that may be used as a p-type semiconductor and an n-type semiconductor may include, for example, an alkaline metal-Group VI compound, a Group II-Group VI compound, a Group IV-Group VI compound, a Group III-Group V compound, a Group IV element or compound, graphene, or a combination thereof.

The alkaline metal-Group VI compound may include, for example, a binary compound such as MgO, MgS, MgSe, MgTe, CaO, CaS, CaSe, CaTe, SrO, SrS, SrSe, SrTe, BaO, BaS, BaSe, or BaTe, or a combination thereof.

The Group II-Group VI compound may include, for example, at least one of a binary compound such as ZnS, ZnSe, ZnTe, CdS, CdSe, CdTe, ZnO, HgS, HgSe, or HgTe; a ternary compound such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, or HgZnSe; a quaternary compound such as CdHgZnTe, CdZnSeS, CdZnSeTe, CdZnSTe, CdHgSeS, CdHgSeTe, CdHgSTe, HgZnSeS, HgZnSeTe, or HgZnSTe; or a combination thereof.

The Group III-Group V compound may include, for example, at least one of a binary compound such as GaN, GaP, GaAs, GaSb, AlN, AlP, AlAs, AlSb, InN, InP, InAs, or InSb; a ternary compound such as GaNP, GaNAs, GaNSb, GaPAs, GaPSb, AlNP, AlNAs, AlNSb, AlPAs, AlPSb, InNP, InNAs, InNSb, InPAs, or InPSb; a quaternary compound such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, or InAlPSb; or a combination thereof.

The Group IV-Group VI compound may include, for example, at least one of a binary compound such as SnS, SnSe, SnTe, PbS, PbSe, or PbTe; a ternary compound such as SnSeS, SnSeTe, SnSTe, PbSeS, PbSeTe, PbSTe, SnPbS, SnPbSe, or SnPbTe; a quaternary compound such as SnPbSSe, SnPbSeTe, or SnPbSTe; or a combination thereof.

The Group IV compound may include, for example, Si, Ge, SiGe, SiC, or a combination thereof.

The graphene quantum dot may be a quantum dot composed of graphene.

The quantum dot may have a core-shell structure having a single-shell, a particle structure having no shell (i.e., a core-only structure), or a multi-shell structure having a plurality of shells. Specific examples of the quantum dot having the particle structure without a shell may be CdSe, InP, or the like. The quantum dot having the core-shell structure having a single-shell may have a CdSe/CdS (core/shell) structure, an InP/ZnS (core/shell) structure, and the like. The quantum dot having the core-shell-shell structure having a double-shell may have, for example, a CdSe/CdS/ZnS (core/shell/shell) structure and the like. However, the aforementioned specific materials and a combination thereof are examples, but various materials may be combined therewith. In addition, if necessary, an alloy portion may be formed between the core portion and the shell portion, and a particular (or, alternatively, predetermined) dopant may be used to dope the quantum dot.

The photoelectric conversion layer 110 may be an intrinsic layer (an I layer) wherein the p-type semiconductor and the n-type semiconductor are mixed as a bulk heterojunction. Accordingly, it will be understood that at least one photoelectric conversion device of the optical wireless receiver 20 may include an intrinsic layer (an I layer) in which the p-type semiconductor of the at least one photoelectric conversion device and the n-type semiconductor of the at least one photoelectric conversion device are mixed in a bulk heterojunction form. Herein, the p-type semiconductor and the n-type semiconductor may be mixed in a volume ratio of about 1:9 to about 9:1, for example about 2:8 to about 8:2, about 3:7 to about 7:3, about 2:1 to about 1:2, about 4:6 to about 6:4, or about 5:5.

The photoelectric conversion layer 110 may be a bilayer including a p-type layer including the aforementioned p-type semiconductor and an n-type layer including the aforementioned n-type semiconductor. Herein, a thickness ratio of the p-type layer and the n-type layer may be about 1:9 to about 9:1, for example about 2:8 to about 8:2, about 3:7 to about 7:3, about 4:6 to about 6:4, or about 5:5.

The photoelectric conversion layer 110 may further include a p-type layer and/or an n-type layer which are in direct contact with the intrinsic layer in addition to the intrinsic layer. Accordingly, it will be understood that at least one photoelectric conversion device of the optical wireless receiver 20 that includes an intrinsic layer (an I layer) in which the p-type semiconductor of the at least one photoelectric conversion device and the n-type semiconductor of the at least one photoelectric conversion device are mixed in a bulk heterojunction form may further include a p-type layer and/or an n-type layer which are in direct contact with the intrinsic layer. The p-type layer may include the aforementioned p-type semiconductor and the n-type layer may include the aforementioned n-type semiconductor. The p-type layer, n-type layer and intrinsic layer in the photoelectric conversion layer 110 may be for example included in various combinations of p-type layer/I layer, I layer/n-type layer, p-type layer/I layer/n-type layer, and the like.

It will be understood that the photoelectric conversion layer 110 may include a quantum dot, a quinoid metal complex compound, a polymethine compound, a cyanine compound, a phthalocyanine compound, a merocyanine compound, a naphthalocyanine compound, an immonium compound, a diimmonium compound, a triarylmethane compound, a dipyrromethene compound, an anthraquinone compound, naphthoquinone, a diquinone compound, a naphthoquinone compound, an anthraquinone compound, a squarylium compound, a rylene compound, a perylene compound, a squaraine compound, a pyrylium compound, a squaraine compound, a thiopyrylium compound, a diketopyrrolopyrrole compound, a boron dipyrromethene compound, a nickel-dithiol complex compound, a croconium compound, a derivative thereof, or a combination thereof.

The photoelectric conversion device 100 may further include an anti-reflection layer (not shown) on one surface of the first electrode 120 or the second electrode 130. The anti-reflection layer is disposed at a light incidence side and lowers reflectance of light of incident light and thereby light absorbance is further improved. For example, when light is incident to the first electrode 120, the anti-reflection layer may be disposed on one surface of the first electrode 120, and when light is incident to the second electrode 130, anti-reflection layer may be disposed on one surface of the second electrode 130.

The anti-reflection layer may include, for example a material having a refractive index of about 1.6 to about 2.5 and may include for example at least one of metal oxide, metal sulfide, or an organic material having a refractive index within the ranges. The anti-reflection layer may include, for example a metal oxide such as an aluminum-containing oxide, a molybdenum-containing oxide, a tungsten-containing oxide, a vanadium-containing oxide, a rhenium-containing oxide, a niobium-containing oxide, a tantalum-containing oxide, a titanium-containing oxide, a nickel-containing oxide, a copper-containing oxide, a cobalt-containing oxide, a manganese-containing oxide, a chromium-containing oxide, a tellurium-containing oxide, or a combination thereof; a metal sulfide such as a zinc sulfide; or an organic material such as an amine derivative, but is not limited thereto.

In the photoelectric conversion device 100, when light enters from the first electrode 120 or the second electrode 130 and the photoelectric conversion layer 110 absorbs light in a particular (or, alternatively, predetermined) wavelength region, excitons may be produced thereinside. The excitons are separated into holes and electrons in the photoelectric conversion layer 110, and the separated holes are transported to an anode that is one of the first electrode 120 and the second electrode 130 and the separated electrons are transported to the cathode that is the other of the first electrode 120 and the second electrode 130 so as to flow a current.

Each thickness of the first electrode 120, the second electrode 130, and the photoelectric conversion layer 110 of the photoelectric conversion device 100 may be for example less than or equal to about 1100 nm, less than or equal to about 1000 nm, less than or equal to about 750 nm, or less than or equal to about 500 nm, and for example greater than or equal to about 5 nm, greater than or equal to about 10 nm, greater than or equal to about 20 nm, greater than or equal to about 30 nm, greater than or equal to about 40 nm, greater than or equal to about 50 nm, or greater than or equal to about 100 nm, for example about 5 nm to about 1100 nm, for example about 50 nm to about 1100 nm, or about 50 nm to about 1000 nm in order to obtain down-sizing and integration of the light-receiving sensor 21.

In some example embodiments, the second photoelectric conversion device 100b may be stacked, in a vertical direction that extends perpendicular to the upper surface 146U of the substrate 146, to have an overlapping region 701 with the first photoelectric conversion device 100a and the third photoelectric conversion device 100c may be stacked to have an overlapping region 701 with at least one of the first photoelectric conversion device 100a or the second photoelectric conversion device 100b. Restated, the second photoelectric conversion device 100b may extend at least partially in parallel with the first photoelectric conversion device 100a in a first direction extending parallel to the upper surface 146U of the substrate 146 (e.g., the X-direction) and may at least partially overlap the first photoelectric conversion device 100a in a second direction that is perpendicular to the first direction and extends perpendicular to the upper surface 146U of the substrate 146 (e.g., the Y-direction), and the third photoelectric conversion device 100c may extend at least partially in parallel with both the first and second photoelectric conversion devices 100a and 100b in the first direction and may at least partially overlap at least one photoelectric conversion device of the first photoelectric conversion device 100a or the second photoelectric conversion device 100b in the second direction.

For example, the third photoelectric conversion device 100c may be stacked to have an overlapping region 701 with (e.g., at least partially overlap in the second direction, or Y-direction, with) the first photoelectric conversion device 100a and the third photoelectric conversion device 100c may be disposed at the rear of the first photoelectric conversion device 100a, based on a transmission direction of the optical discrete-time signal as a reference (e.g., between the first photoelectric conversion device 100a and a substrate 146, distal to an incident light side 601 of the light-receiving sensor 21 in relation to the first photoelectric conversion device 100a, etc.).

For example, all the first photoelectric conversion device 100a, the second photoelectric conversion device 100b, and the third photoelectric conversion device 100c may be stacked to have an overlapping region 701 (e.g., at least partially overlap in the second direction, or Y-direction) and the first photoelectric conversion device 100a and the second photoelectric conversion device 100b may be disposed at the rear of the third photoelectric conversion device 100c, based on a transmission direction of the optical discrete-time signal as a reference (e.g., between the third photoelectric conversion device 100c and a substrate 146, distal to an incident light side 601 of the light-receiving sensor 21 in relation to the third photoelectric conversion device 100c, etc.).

Hereinafter, various examples of the light-receiving sensor 21 formed by varying disposition relationship of a plurality of photoelectric conversion devices are illustrated referring to FIGS. 6 to 13.

Figure 6:
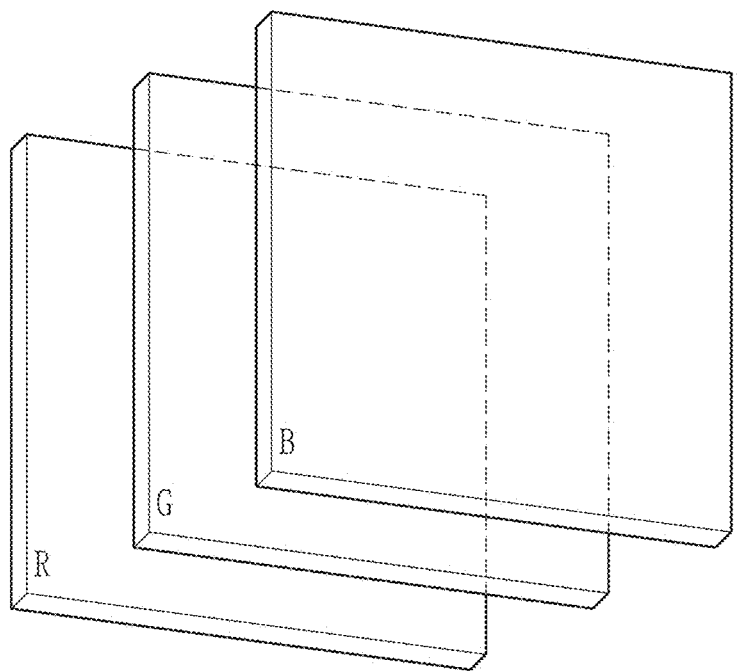
FIG. 6 is a top plan view schematically illustrating an example of a light-receiving sensor according to some example embodiments.
Figure 7:
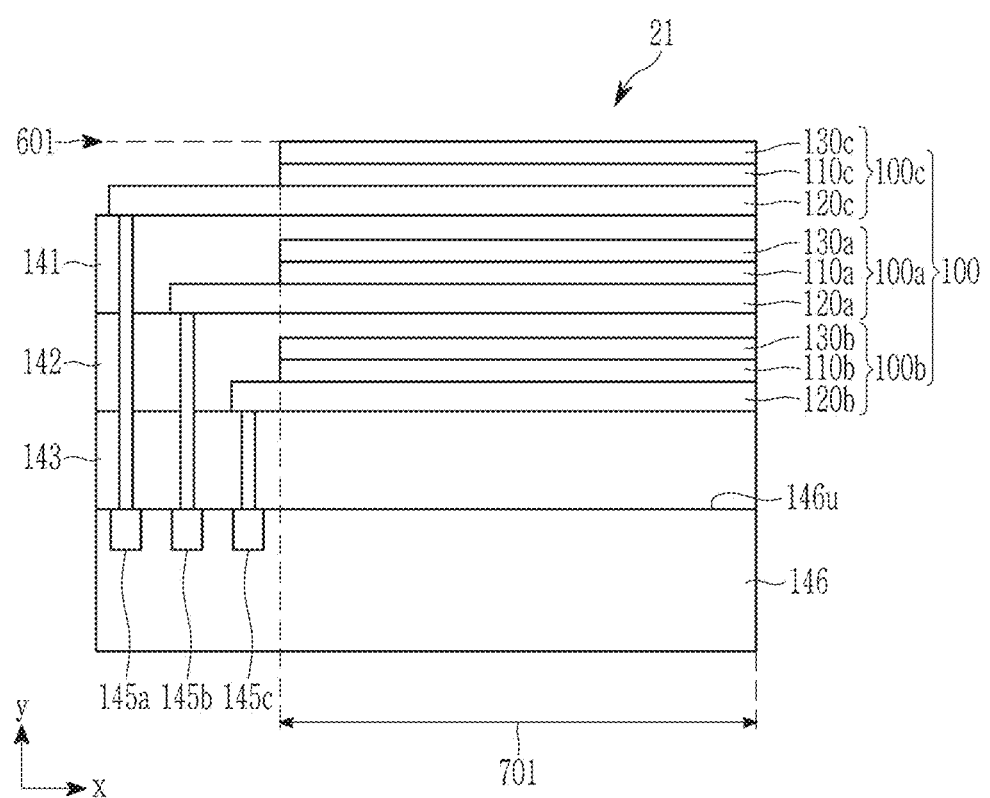
FIG. 7 is a schematic cross-sectional view of the light-receiving sensor of FIG. 6.

FIG. 6 is a top plan view schematically illustrating an example of a light-receiving sensor according to some example embodiments and FIG. 7 is a schematic cross-sectional view of the light-receiving sensor of FIG. 6.

Referring to FIGS. 6 and 7, the light-receiving sensor 21 according to some example embodiments includes a third photoelectric conversion device 100c configured to selectively absorb light in a blue wavelength region, a first photoelectric conversion device 100a configured to selectively absorb light in a green wavelength region, and a second photoelectric conversion device 100b configured to selectively absorb light in a red wavelength spectrum which are stacked from the front to the rear, based on a transmission direction of the optical discrete-time signal as a reference (e.g., proximate to distal to an incident light side 601 of the light-receiving sensor 21), such that the first photoelectric conversion device 100a and the second photoelectric conversion device 100b are distal to the incident light side 601 in relation to the third photoelectric conversion device 100c, and the second photoelectric conversion device 100b is distal to the incident light side 601 in relation to the first photoelectric conversion device 100a. The first to third photoelectric conversion devices 100a, 100b, and 100c have overlapping regions 701, aligned with each other in the second direction that extends perpendicular to the upper surface 146U of the substrate 146, or Y-direction, and is perpendicular to the first direction, or X direction. As shown in FIG. 7, the overlapping regions 701 of the first to third photoelectric conversion devices 100a to 100c may be common to each other (e.g., may have a common size, area, and/or shape in the second direction, as shown in FIG. 7, so that the respective regions 701 of the photoelectric conversion devices 100a to 100c that overlap with the other photoelectric conversion devices 100a to 100c have a common size, area, and/or shape).

It will be understood that, as described herein, the incident light side 601 is the side of a light-receiving sensor 21, 21', 21", 21''', or the like, that is configured to be incident to the light emitted by the optical wireless transmitter 10, including optical discrete-time signals of one or more light beams, and thus is the side of the light-receiving sensor 21, 21', 21", 21''', or the like via which the light emitted by the optical wireless transmitter 10, including optical discrete-time signals of one or more light beams, is received into the light-receiving sensor 21, 21', 21", 21''', or the like.

It will be understood that the incident light side 601 of a light-receiving sensor 21, 21', 21", 21'", or the like, may be interchangeably referred to as an incident light side of an optical wireless receiver 20 included in the light-receiving sensor 21, 21', 21", 21'", or the like.

The light-receiving sensor 21 includes a semiconductor substrate 146, first to third interlayer insulating layers 141, 142, and 143, a first photoelectric conversion device 100*a*, a second photoelectric conversion device 100*b*, and a third photoelectric conversion device 100*c*.

The semiconductor substrate 146 may be a silicon substrate and is integrated with the transmission transistor (not shown) and the charge storages 145*a*, 145*b*, and 145*c*. A metal wire (not shown) and a pad (not shown) are formed on the semiconductor substrate 146. In order to decrease signal delay, the metal wire and pad may be made of a metal having low resistivity, for example, aluminum (Al), copper (Cu), silver (Ag), and alloys thereof, but are not limited thereto. It will be understood that, as referred to herein, an element that is described as being "made of" one or more materials may "at least partially comprise" the one or more materials.

The third interlayer insulating layer 143 is formed on the metal wire and the pad. The third interlayer insulating layer 143 may be made of an inorganic insulating material such as a silicon oxide and/or a silicon nitride, or a low dielectric constant (low K) material such as SiC, SiCOH, SiCO, and SiOF. The third interlayer insulating layer 143 has a trench exposing the charge storage 55. The trench may be filled with fillers.

The second photoelectric conversion device 100*b* is formed on the third interlayer insulating layer 143.

The second photoelectric conversion device 100*b* includes a first electrode 120*b* and a second electrode 130*b* facing each other, and a photoelectric conversion layer 110*b* disposed between the first electrode 120*b* and the second electrode 130*b*. The first electrode 120*b*, the second electrode 130*b*, and the photoelectric conversion layer 110*b* are the same as described above, and the photoelectric conversion layer 110*b* may selectively absorb light in a red wavelength spectrum.

The second interlayer insulating layer 142 is formed on the second photoelectric conversion device 100*b*. The material and schematic configuration of the second interlayer insulating layer 142 is the same as those of the third interlayer insulating layer 143 and is not described in further detail.

The first photoelectric conversion device 100*a* is formed on the second interlayer insulating layer 142.

The first photoelectric conversion device 100*a* includes a first electrode 120*a* and a second electrode 130*a* facing each other, and a photoelectric conversion layer 110*a* disposed between the first electrode 120*a* and the second electrode 130*a*. The first electrode 120*a*, the second electrode 130*a*, and the photoelectric conversion layer 110*a* are the same as described above, and the photoelectric conversion layer 110*a* may selectively absorb light in a green wavelength spectrum.

The first interlayer insulating layer 141 is formed on the first photoelectric conversion device 100*a*. The material and schematic configuration of the first interlayer insulating layer 141 is the same as those of the third interlayer insulating layer 143 and is not described in further detail.

The third photoelectric conversion device 100*c* is formed on the first interlayer insulating layer 141. The third photoelectric conversion device 100*c* includes a first electrode 120*c* and a second electrode 130*c* facing each other, and a photoelectric conversion layer disposed between the first electrode 120*c* and the second electrode 130*c*. The first electrode 120*c*, the second electrode 130*c*, and the photoelectric conversion layer 110*c* are the same as described above, and the photoelectric conversion layer 110*c* may selectively absorb light in a blue wavelength spectrum.

Focusing lens (not shown) may be further formed on the third photoelectric conversion device 100*c*. The focusing lens may control a direction of incident light and gather the light in one region. The focusing lens may have a shape of, for example, a cylinder or a hemisphere, but is not limited thereto.

Meanwhile, in the drawing, the third photoelectric conversion device 100*c*, the first photoelectric conversion device 100*a*, and the second photoelectric conversion device 100*b* are sequentially stacked, but the stack order may be changed variously.

The first photoelectric conversion device 100*a*, the second photoelectric conversion device 100*b*, and the third photoelectric conversion device 100*c* absorbing light in different wavelength spectra have a stacked structure to have a common overlapping region 701 (e.g., may have a common size, area, and/or shape in the second direction, as shown in FIG. 7, so that the respective regions 701 of the photoelectric conversion devices 100*a* to 100*c* that overlap with the other photoelectric conversion devices 100*a* to 100*c* have a common size, area, and/or shape) and thus may down-size the light-receiving sensor 21 and simultaneously, increase a light-receiving area of each photoelectric conversion device.

In some example embodiments, each photoelectric conversion device of the first photoelectric conversion device 100*a*, the second photoelectric conversion device 100*b*, and the third photoelectric conversion device 100*c* may have a light-receiving area that is at least greater than or equal to about 0.1 $\mu m^2$ or greater than or equal to about 1 $\mu m^2$, and for example, less than or equal to about 100 mm$^2$ or less than or equal to about 10 mm$^2$, and for example, in a range of about 0.1 $\mu m^2$ to about 100 mm$^2$, about 1 $\mu m^2$ to about 100 mm$^2$, or about 1 $\mu m^2$ to about 10 mm$^2$ with consideration to the down-sizing of the light-receiving sensor 21.

Therefore, when using the light-receiving sensor 21 according to some example embodiments, an optical wireless communication system capable of high speed/high efficiency data transmission may be provided.

Figure 8:
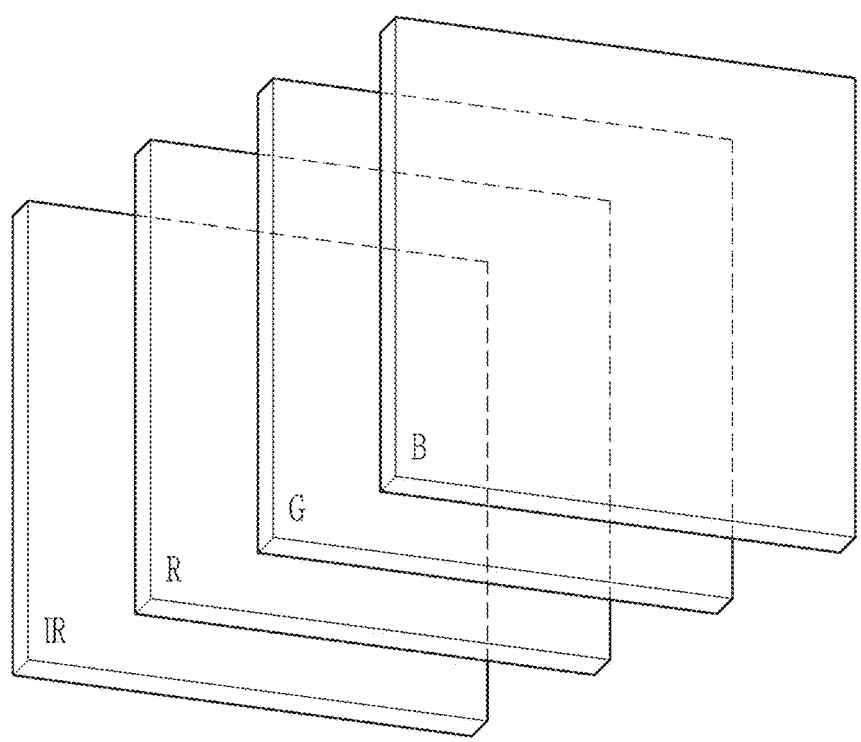
FIG. 8 is a top plan view schematically illustrating an example of a light-receiving sensor according to some example embodiments.
Figure 9:
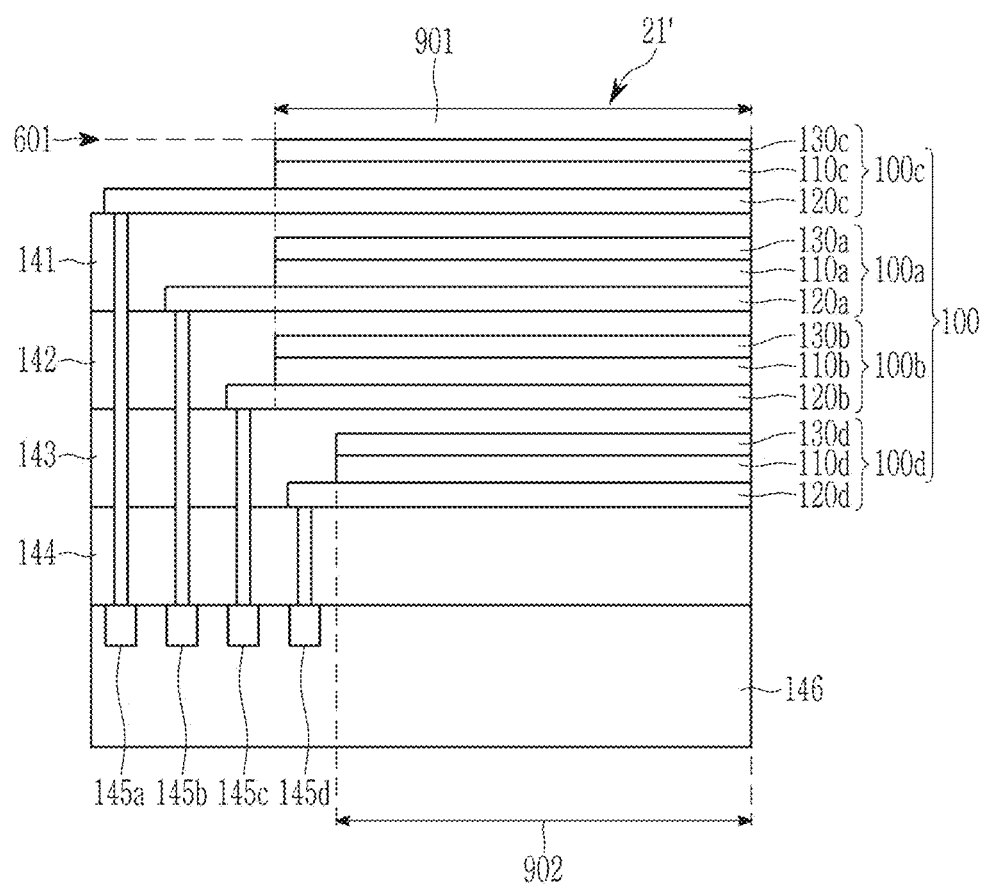
FIG. 9 is a schematic cross-sectional view of the light-receiving sensor of FIG. 8.

FIG. 8 is a top plan view schematically illustrating an example of a light-receiving sensor according to some example embodiments and FIG. 9 is a schematic cross-sectional view of the light-receiving sensor of FIG. 8.

Referring to FIGS. 8 and 9, the light-receiving sensor 21' according to some example embodiments has a structure of stacking a fourth photoelectric conversion device 100*d* configured to selectively absorb light in an infrared wavelength spectrum, and thus is configured to selectively absorb a discrete-time signal of light in the infrared wavelength spectrum and is configured to convert the discrete-time signal of the light in the infrared wavelength spectrum into a fourth photoelectric conversion signal, in addition to the light-receiving sensor 21 according to FIGS. 6 to 7.

The fourth photoelectric conversion device 100*d* may be disposed at the rear of the first to third photoelectric conversion devices 100*a*, 100*b*, and 100*c*, with a transmission direction of the optical discrete-time signal as a reference (e.g., distal to an incident light side 601 of the light-receiving sensor 21 in relation to the first to third photoelectric conversion devices 100*a*, 100*b*, and 100*c*), specifically, at the rear of the first to second photoelectric conversion devices 100*a* and 100*b* (e.g., distal to an incident light side 601 of the light-receiving sensor 21 in relation to the first and second photoelectric conversion devices 100a and 100b), and more specifically, at the rear of the second photoelectric conversion device 100b (e.g., distal to an incident light side 601 of the light-receiving sensor 21 in relation to the second photoelectric conversion device 100b). The first to fourth photoelectric conversion devices 100a, 100b, 100c, and 100d may have overlapping regions 901, 902 that are at least partially common to each other (e.g., all of the first to fourth photoelectric conversion devices 100a, 100b, 100c, and 100d may at least partially overlap each other in the second direction, or Y-direction within overlapping regions 901, 902 that are aligned in the second direction). For example, as shown in FIG. 9, all of the first to fourth photoelectric conversion devices 100a, 100b, 100c, and 100d have overlapping regions 902 that overlap each of the other photoelectric conversion devices but amount to different proportions of the total area of the respective photoelectric conversion devices, where the overlapping region 902 of the fourth photoelectric conversion device 100d occupies an entirety of the area of the photoelectric conversion layer 110d and the overlapping regions 902 of the first to third photoelectric conversion devices 100a to 100c occupy limited portions of the areas of the respective photoelectric conversion layers 110a to 110c. In addition, as shown in FIG. 9, the first to third photoelectric conversion devices 100a, 100b, and 100c have overlapping regions 901 that are common to each other (e.g., have a same size, area, and/or shape) but are different from the largest overlapping region 902 of the fourth photoelectric conversion device 100d.

The light-receiving sensor 21' includes a semiconductor substrate 146, the first to fourth interlayer insulating layers 141, 142, 143, and 144, the first photoelectric conversion device 100a, the second photoelectric conversion device 100b, the third photoelectric conversion device 100c, and thus fourth photoelectric conversion device 100d.

The semiconductor substrate 146 and a metal wire (not shown) and a pad (not shown) formed on the semiconductor substrate 146 are the same as described above.

The fourth interlayer insulating layer 144 is formed on the metal wire and the pad. The material and schematic configuration of the fourth interlayer insulating layer 144 is the same as those of the third interlayer insulating layer 143 and is not described in further detail.

The fourth photoelectric conversion device 100d is formed on the fourth interlayer insulating layer 144.

The fourth photoelectric conversion device 100d includes a first electrode 120b and a second electrode 130b, and a photoelectric conversion layer 110d disposed between the first electrode 120b and the second electrode 130b. The first electrode 10a, the second electrode 20a, and the photoelectric conversion layer 110d are the same as described above, and the photoelectric conversion layer 110d may selectively absorb light in an infrared or ultraviolet wavelength spectrum.

In some example embodiments, the fourth photoelectric conversion device 100d may include a photoelectric conversion layer 110d that includes quantum dot, a quinoid metal complex compound, a polymethine compound, a cyanine compound, a phthalocyanine compound, a merocyanine compound, a naphthalocyanine compound, an immonium compound, a diimmonium compound, a triarylmethane compound, a dipyrromethene compound, an anthraquinone compound, naphthoquinone, a diquinone compound, a naphthoquinone compound, an anthraquinone compound, a squarylium compound, a rylene compound, a perylene compound, a squaraine compound, a pyrylium compound, a squaraine compound, a thiopyrylium compound, a diketopyrrolopyrrole compound, a boron dipyrromethene compound, a nickel-dithiol complex compound, a croconium compound, a derivative thereof, or a combination thereof.

A third interlayer insulating layer 143 is formed on the fourth photoelectric conversion device 100d. The third interlayer insulating layer 143 is the same as described above.

On the third interlayer insulating layer 143, the second photoelectric conversion device 100b, the second interlayer insulating layer 142, the first photoelectric conversion device 100a, the first interlayer insulating layer 141, and the third photoelectric conversion device 100c are sequentially formed, and each constituent element is the same as described above.

A focusing lens (not shown) may be further formed on the third photoelectric conversion device 100c and a configuration of the focusing lens is the same as described above.

Meanwhile, in the drawing, the third photoelectric conversion device 100c, the first photoelectric conversion device 100a, the second photoelectric conversion device 100b, and the fourth photoelectric conversion device 100d are sequentially stacked, but the stack order may be changed variously.

As aforementioned, the information transmission type of the optical wireless communication system may be extended by forming a stacked structure of additionally disposing the fourth photoelectric conversion device 100d configured to selectively absorb light in an infrared or ultraviolet wavelength spectrum with the first photoelectric conversion device 100a, the second photoelectric conversion device 100b, and the third photoelectric conversion device 100c configured to absorb light in the visible wavelength spectrum to have a common overlapping region 902.

In some example embodiments, the fourth photoelectric conversion device 100d may have a light-receiving area of at least greater than or equal to about 0.1 $\mu m^2$ or greater than or equal to about 1 $\mu m^2$, for example less than or equal to about 100 $mm^2$ or less than or equal to about 10 $mm^2$, and for example, in a range of about 0.1 $\mu m^2$ to about 100 $mm^2$, about 1 $\mu m^2$ to about 100 $mm^2$, or about 1 $\mu m^2$ to about 10 $mm^2$ with consideration to the down-sizing of the light-receiving sensor 21.

Accordingly, when the light-receiving sensor 21' according to some example embodiments is used, the optical wireless communication system capable of transmitting data with high speed/high efficiency as well as having the more extended information transmission type may be provided.

Figure 10:
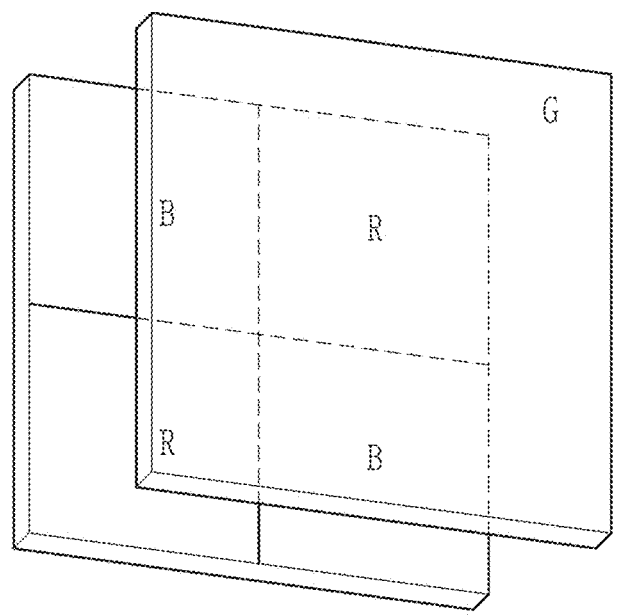
FIG. 10 is a top plan view schematically illustrating an example of a light-receiving sensor according to some example embodiments.
Figure 11:
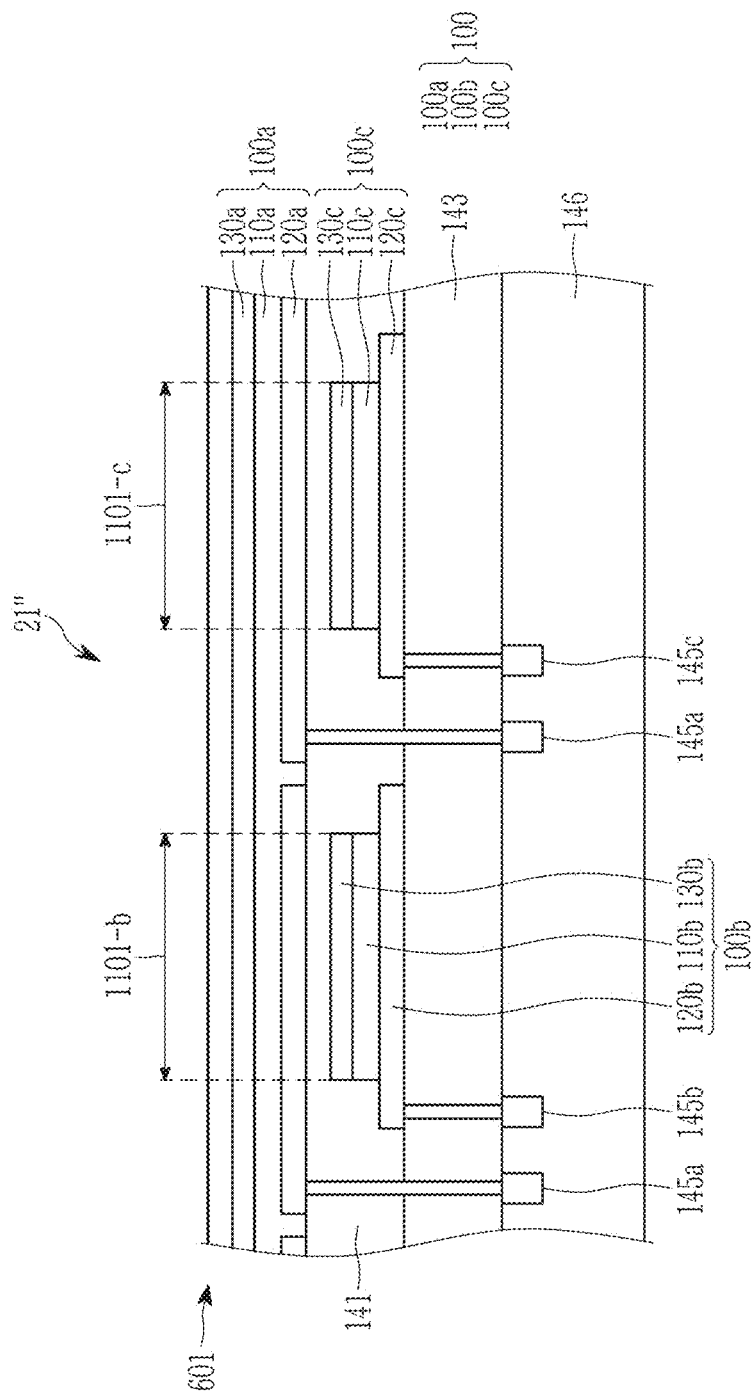
FIG. 11 is a schematic cross-sectional view of the light-receiving sensor of FIG. 10.

FIG. 10 is a top plan view schematically illustrating an example of a light-receiving sensor according to some example embodiments, and FIG. 11 is a schematic cross-sectional view of the light-receiving sensor of FIG. 10.

Referring to FIG. 10 and 11, the light-receiving sensor 21" according to some example embodiments has a structure in which a first photoelectric conversion device 100a configured to selectively absorb light in a green wavelength spectrum is disposed from the front to the rear, with a transmission direction of the optical discrete-time signal as a reference (e.g., proximate to distal to an incident light side 601 of the light-receiving sensor 21'), and a second photoelectric conversion device 100b configured to selectively absorb light in a red wavelength spectrum and a third photoelectric conversion device 100c configured to selectively absorb light in a blue wavelength spectrum are disposed in parallel at the rear of the first photoelectric conversion device 100a (e.g., distal to an incident light side 601 of the light-receiving sensor 21' in relation to the first photoelectric conversion device 100a). The second and third photoelectric conversion devices 100b and 100c have a separate overlapping region with each first photoelectric conversion device 100a (e.g., second and third photoelectric conversion devices 100b and 100c may at least partially overlap the first photoelectric conversion device 100a in the second direction, or Y-direction within separate, respective overlapping regions 1101b, 1101c that are aligned in the second direction and thus the second and third photoelectric conversion devices 100b and 100c may at least partially overlap separate, respective regions of the first photoelectric conversion device 100a in the second direction), but do not have overlapping regions between the second and third photoelectric conversion devices 100b and 100c (e.g., second and third photoelectric conversion devices 100b and 100c do not overlap each other at all in the second direction, or Y-direction).

The light-receiving sensor 21" includes a semiconductor substrate 146, first to second interlayer insulating layers 141 and 142, the first photoelectric conversion device 100a, the second photoelectric conversion device 100b, and the third photoelectric conversion device 100c.

The semiconductor substrate 146 and a metal wire (not shown) and a pad (not shown) formed on the semiconductor substrate 146 are the same as described above.

The second interlayer insulating layer 142 is formed on the metal wire and the pad. The second interlayer insulating layer 142 is the same as described above.

On the second interlayer insulating layer 142, the second photoelectric conversion device 100b and the third photoelectric conversion device 100c are disposed in parallel. In some example embodiments, the second photoelectric conversion device 100b and the third photoelectric conversion device 100c are respectively the same as aforementioned and thus will be not further described in detail.

On the second photoelectric conversion device 100b and the third photoelectric conversion device 100c, the first interlayer insulating layer 141 is formed. The first interlayer insulating layer 141 is the same as described above.

On the first interlayer insulating layer 141, the first photoelectric conversion device 100a is formed, and this first photoelectric conversion device 100a is the same as described above.

On the first photoelectric conversion device 100a, focusing lens (not shown) may be further formed, and the focusing lens have the same structure as described above.

In some example embodiments, including the example embodiments as shown in FIGS. 10-11, the second photoelectric conversion device 100b and the third photoelectric conversion device 100c are disposed in parallel under the first photoelectric conversion device 100a but not limited thereto, but a stacking order thereof may be variously changed.

In addition, in some example embodiments including the example embodiments shown in FIGS. 10-11, the second photoelectric conversion device 100b and the third photoelectric conversion device 100c respectively include the first electrode 120, the second electrode 130, and the photoelectric conversion layer 110 but are not limited thereto, and at least one of the second photoelectric conversion device 100b or the third photoelectric conversion device 100c may be a publicly-known photodiode including silicon, germanium, or a combination thereof. Herein, a photoelectric conversion device selected as the photodiode out of the second photoelectric conversion device 100b and the third photoelectric conversion device 100c may not be disposed on the second interlayer insulating layer 142 but integrated in the semiconductor substrate 146.

Figure 12:
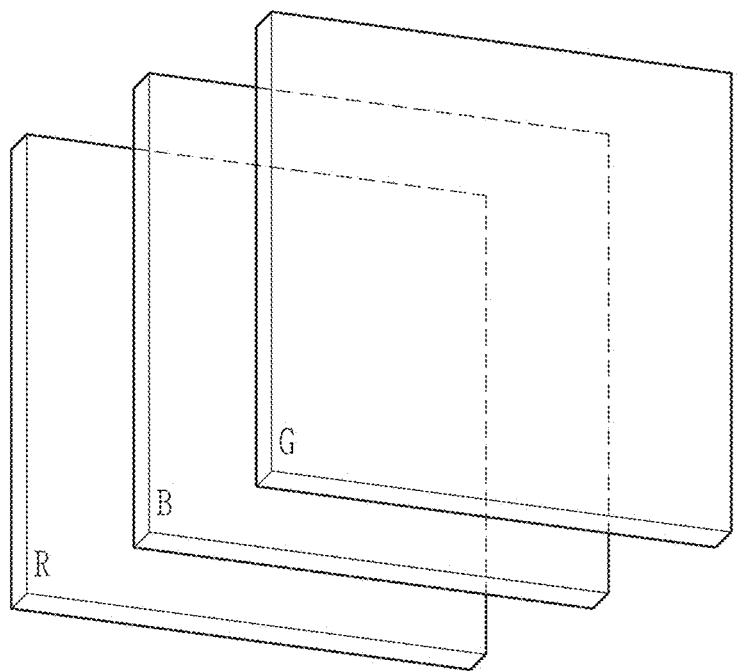
FIG. 12 is a top plan view schematically illustrating an example of a light-receiving sensor according to some example embodiments.
Figure 13:
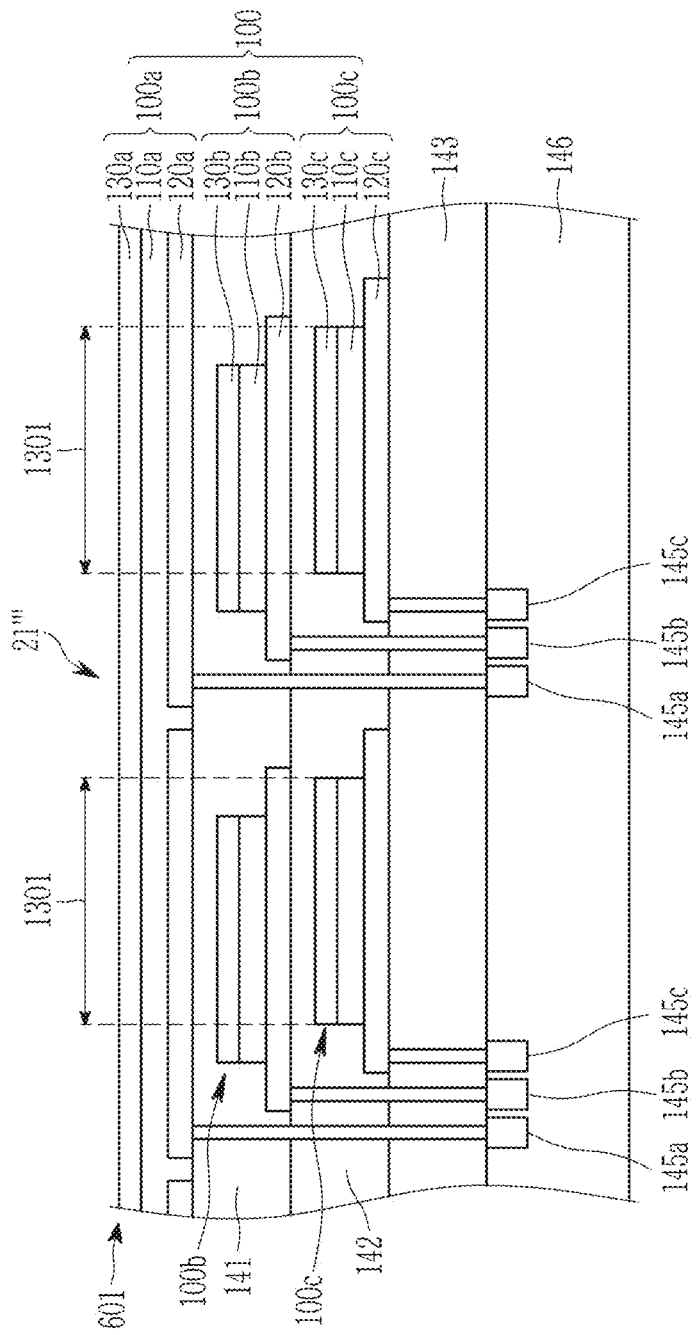
FIG. 13 is a schematic cross-sectional view of the light-receiving sensor of FIG. 12, and FIGS. 14, 15, and 16 are schematic views of the light-receiving operation of various optical wireless receivers in an optical wireless communication system according to some example embodiments.

FIG. 12 is a top plan view schematically illustrating an example of a light-receiving sensor according to some example embodiments, and FIG. 13 is a schematic cross-sectional view of the light-receiving sensor of FIG. 12.

Referring to FIGS. 12 and 13, a light-receiving sensor 21'" according to some example embodiments may have a structure of stacking the first photoelectric conversion device 100a configured to selectively absorb light in a green wavelength spectrum, the third photoelectric conversion device 100c configured to selectively absorb light in a blue wavelength spectrum, and the second photoelectric conversion device 100b configured to selectively absorb light in a red wavelength spectrum sequentially from the front to the rear, based on a transmission direction of the optical discrete-time signal as a reference (e.g., proximate to distal to an incident light side 601 of the light-receiving sensor 21'"). The first to third photoelectric conversion devices 100a, 100b, and 100c have overlapping regions that are at least common to each other (e.g., first to third photoelectric conversion devices 100a to 100c may at least partially overlap each other in the second direction, or Y-direction within a common overlapping region 1301, where separate stacks of second to third photoelectric conversion devices 100b to 100c may at least partially overlap separate, respective portions of the first photoelectric conversion device 100a in separate, respective overlapping regions 1301).

The light-receiving sensor 21'" according to some example embodiments has similar stacking relationship of the first to third photoelectric conversion devices 100a, 100b, and 100c to that of the light-receiving sensor 21 according to some example embodiments but is different from the light-receiving sensor 21 according to some example embodiments in that the first photoelectric conversion device 100a is disposed at the upfront of the optical discrete-time signal transmission direction.

As described above, the optical wireless communication system according to some example embodiments has various disposition relationships of the first photoelectric conversion device 100a, the second photoelectric conversion device 100b, and the third photoelectric conversion device 100c respectively configured to absorb light in different wavelength spectra as shown in the light-receiving sensor 21" according to some example embodiments and the light-receiving sensor 21'" according to some example embodiments and accordingly, may provide various dispositions of a light-receiving sensor depending on an applying place of the optical wireless communication system, sizes and types of an optical wireless transmitter and/or an optical wireless receiver, and the like.

While FIG. 13 illustrates two separate stacks of second and third photoelectric conversion devices 100b and 100c, it will be understood that the photoelectric conversion device 100 may include a single stack of second and third photoelectric conversion devices 100b and 100c.

Additionally, while FIGS. 6-13 illustrate example embodiments of photoelectric conversion devices 100 that include at least the first to third photoelectric conversion devices 100a to 100c, and FIGS. 2-5 illustrate a light source 13 configured to emit discrete-time signals of at least first to third light beams that correspond to the first to third photoelectric conversion devices 100a to 100c, it will be understood that, in some example embodiments, the light source 13 may be configured to emit discrete-time signals of a plurality of light beams, which may include or omit one or more of the first to fourth light beams as described herein (e.g., emit discrete-time signals of the first, third, and fourth light beams but not the second light beam, emit discrete time signals of the first and second light beams but not the third nor fourth light beams, etc.), and the optical wireless receiver 20 may include or omit one or more of the first to fourth photoelectric conversion devices 100a to 100d (e.g., may include the first, third, and fourth photoelectric conversion devices 100a, 100c, and 100d but not the second photoelectric conversion device 100b, may include the first and second photoelectric conversion devices 100a and 100b but not the third nor fourth photoelectric conversion devices 100c or 100d, etc.). It will be understood that, in some example embodiments, the light source 13 may be configured to emit, either alone or in combination with one or more discrete-time signals of one or more visible light beams, at least a discrete-time signal of an infrared light beam, a discrete-time signal of an ultraviolet light beam, or both the discrete-time signal of the infrared light beam, and the discrete-time signal of an ultraviolet light beam.

It will be understood that, in some example embodiments, the photoelectric conversion device 100 may include a photoelectric conversion device (e.g., 100d) configured to selectively absorb light belonging to an infrared wavelength spectrum, and thus may be configured to convert a discrete-time signal of an infrared wavelength spectrum into a photoelectric conversion signal. It will be understood that, in some example embodiments, the photoelectric conversion device 100 may include a photoelectric conversion device (e.g., 100d) configured to selectively absorb light belonging to an ultraviolet wavelength spectrum, and thus may be configured to convert a discrete-time signal of an ultraviolet wavelength spectrum into a photoelectric conversion signal. It will be understood that, in some example embodiments, the photoelectric conversion device 100 may include both a photoelectric conversion device (e.g., 100d) configured to selectively absorb light belonging to an infrared wavelength spectrum and a photoelectric conversion device (e.g., 100d) configured to selectively absorb light belonging to an ultraviolet wavelength spectrum, and thus may be configured to convert both a discrete-time signal of an infrared wavelength spectrum and a discrete-time signal of an ultraviolet wavelength spectrum into separate, respective photoelectric conversion signals.

Hereinafter, referring to FIGS. 14 to 15, a data processing method of a data processor included in an optical wireless receiver of an optical data communication system according to some example embodiments is explained.

In some example embodiments, the data processor 22 functions to process the photoelectric conversion signal received from the photoelectric conversion device 100.

Specifically, the data processor 22 may process each of the received photoelectric conversion signals as noise, except for a photoelectric conversion signal, of the received photoelectric conversion signals, having the highest ("greatest") intensity, with reference to light in a particular wavelength spectrum belonging to visible and infrared wavelength spectra.

The photoelectric conversion device 100 may be different depending on a content, a type, and the like of an organic light absorbing material and/or a quantum dot included therein but absorb a small dose of light even in a wavelength spectrum not belonging to a particular (or, alternatively, predetermined) wavelength spectrum of each photoelectric conversion device 100. This small dose of absorbed light may work as a noise for an optical communication.

However, since the photoelectric conversion device 100 according to some example embodiments may process and remove the small dose of absorbed light as a noise, an optical wireless communication system using the same may show excellent performance in terms of accurate information transmission and encryption.

Figure 14:
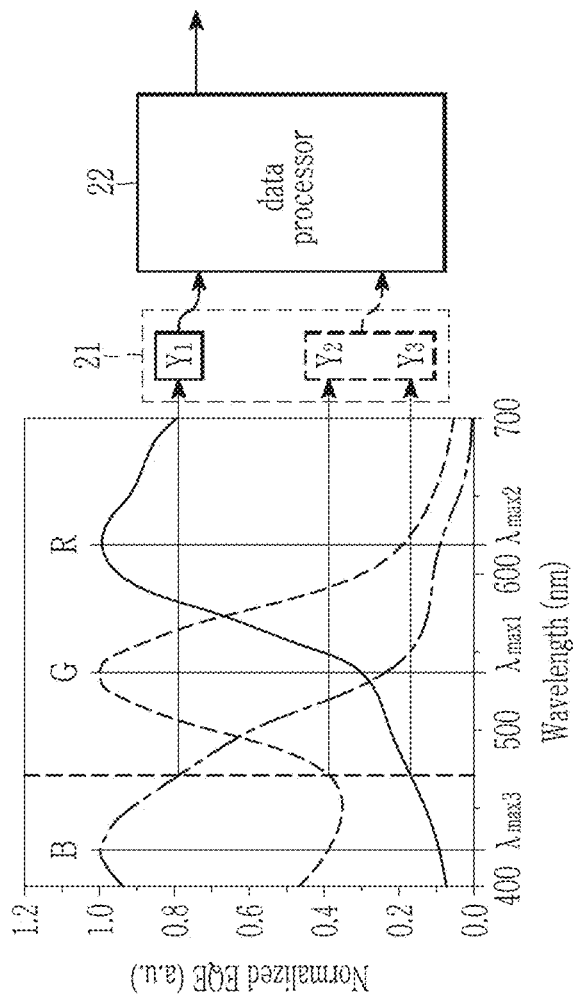
Figure 15:
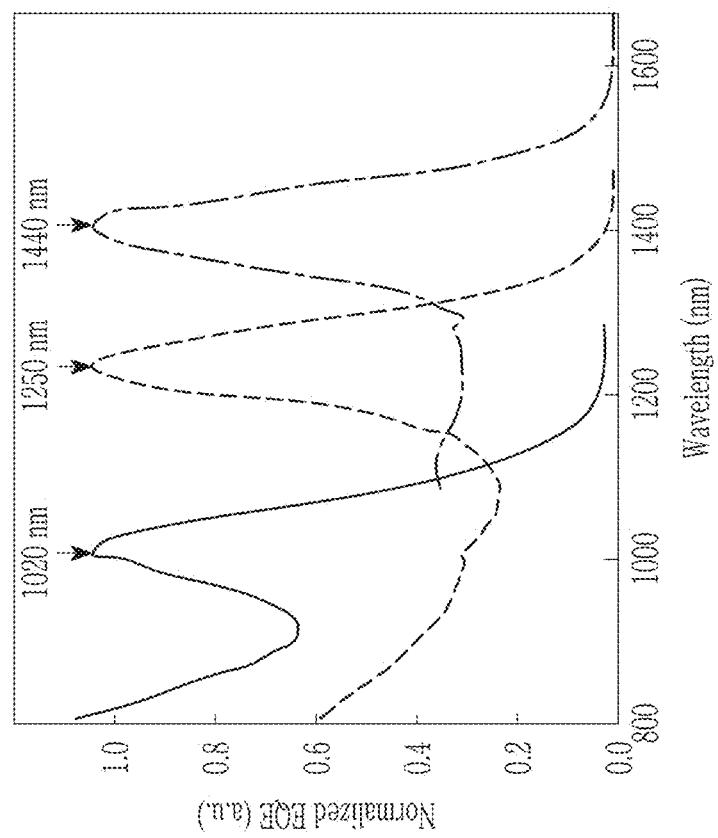
Figure 16:
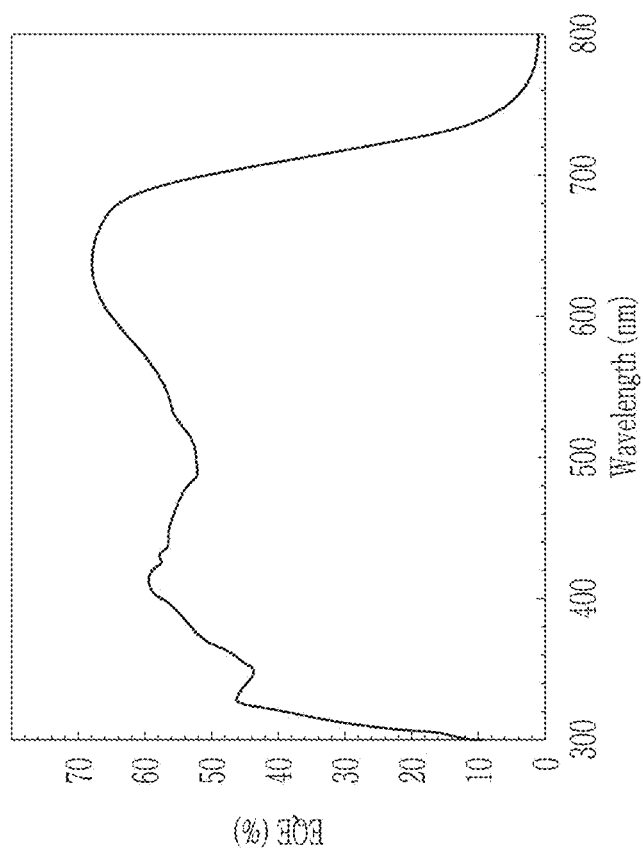

FIGS. 14, 15, and 16 are schematic views of the light-receiving operation of various optical wireless receivers in an optical wireless communication system according to some example embodiments.

FIG. 14 is a graph showing wavelength-external quantum efficiency (normalized EQE) of the light-receiving sensor 21, wherein specifically, the photoelectric conversion device 100 includes an organic light absorbing material, and more specifically, the first photoelectric conversion device 100a includes a p-type and n-type bulk heterojunction photoelectric conversion layer [a blue light absorbing layer, p:n=biphenyl-tri-thiophene (BP3T):fullerene C60=1:3 in a weight ratio), the second photoelectric conversion device 100b includes a p-type and n-type bulk heterojunction photoelectric conversion layer [a green light absorbing layer, p:n=subphthalocyanine (SubPC):C60=1:1 in a weight ratio], and the third photoelectric conversion device 100c includes a p-type and n-type bulk heterojunction photoelectric conversion layer [a red light absorbing layer, p:n=copper phthalocyanine (CuPc):C60=1.5:1 in a weight ratio).

Referring to FIG. 14, when the photoelectric conversion device 100 includes each aforementioned first photoelectric conversion device 100a, second photoelectric conversion device 100b, and third photoelectric conversion device 100c, photoelectric conversion signals on the basis of light of a particular wavelength (about 475 nm) out of the blue wavelength spectrum show the highest ("greatest") intensity (Y1) at blue and lower intensity at green (Y2) and red (Y3) than at blue (Y1) in a wavelength-external quantum efficiency graph of the light-receiving sensor 21. Herein, the data processor 22 may remove the blue (Y1) showing the highest intensity as a noise and calculate a precise wavelength of incident light by combining photoelectric conversion signals of green (Y2) and red (Y3) except for the blue (Y1).

FIG. 15 shows a wavelength-external quantum efficiency graph of the light-receiving sensor 21, when the photoelectric conversion device 100 including a quantum dot, and specifically, the first photoelectric conversion device 100a includes a photoelectric conversion layer including a quantum dot (PbS) having a diameter of about 3 nm to about 4 nm, the second photoelectric conversion device 100b includes a photoelectric conversion layer including a quantum dot (PbS) having a diameter of about 4 nm to about 5 nm, and the third photoelectric conversion device 100c includes a photoelectric conversion layer including a quantum dot (PbS) having about 5 nm to about 6 nm.

Referring to FIG. 15, the wavelength-external quantum efficiency (normalized EQE) graph shows an overall similar profile to that of FIG. 14. Accordingly, referring to FIG. 15, even though the photoelectric conversion device is configured to have at least one photoelectric conversion layer including a quantum dot instead of an organic light absorbing material, the data processor 22 may be used to easily process and remove a noise.

FIG. 16 is a graph showing wavelength-external quantum efficiency (unit: %) of the light-receiving sensor 21, when the photoelectric conversion device 100 absorbs visible light and a portion of infrared light in a range of about 300 nm to about 800 nm and specifically, a p-type and n-type bulk heterojunction photoelectric conversion layer (a red light absorbing layer, p:n=2:1 in a weight ratio).

In FIG. 16, as for the p-type organic light absorbing material, PC$_{71}$BM ([6,6]-phenyl C71 butyric acid methyl ester) is used, and as for the n-type organic light absorbing material, a compound represented by Chemical Formula 2 is used.

[Chemical Formula 2]

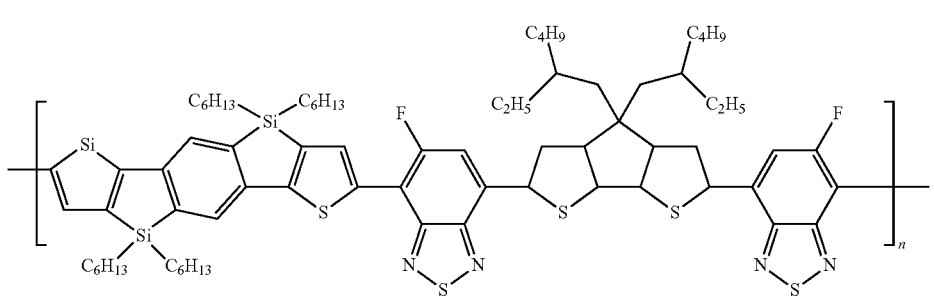

Referring to FIG. 16, the general wavelength-external quantum efficiency graph shows light absorption in a broad wavelength spectrum covering from visible light up to a partial wavelength of infrared light unlike FIG. 14. For example, photoelectric conversion signals based on light of a particular wavelength (about 720 nm) out of the infrared wavelength spectrum show the lowest intensity in blue and green wavelengths and high intensity relative to that of each blue and green in red and infrared wavelengths when analyzed as in FIG. 14.

Herein, the data processor 22 may process and remove the blue and green showing relatively low intensity as a noise and calculate a precise wavelength of incident light by combining the other red and infrared light photoelectric conversion signals.

While this disclosure has been described in connection with what is presently considered to be practical example embodiments, it is to be understood that the inventive concepts are not limited to the disclosed example embodiments, but, on the contrary, is intended to cover various modifications and equivalent arrangements included within the spirit and scope of the appended claims.

What is claimed is:

1. An optical wireless communication system, comprising:
   an optical wireless transmitter configured to emit a discrete-time signal of a first light beam, a discrete-time signal of a second light beam, and a discrete-time signal of a third light beam, the first, second, and third light beams having different wavelength spectra; and
   an optical wireless receiver including
      a first photoelectric conversion device configured to convert the discrete-time signal of the first light beam into a first photoelectric conversion signal,
      a second photoelectric conversion device configured to convert the discrete-time signal of the second light beam into a second photoelectric conversion signal, and
      a third photoelectric conversion device configured to convert the discrete-time signal of the third light beam into a third photoelectric conversion signal,
   wherein the second photoelectric conversion device extends at least partially in parallel with the first photoelectric conversion device in a first direction and at least partially overlaps the first photoelectric conversion device in a second direction that is perpendicular to the first direction, and the third photoelectric conversion device extends at least partially in parallel with both the first and second photoelectric conversion devices in the first direction and at least partially overlaps at least one photoelectric conversion device of the first photoelectric conversion device or the second photoelectric conversion device in the second direction,
   wherein the first light beam is a green light beam, the second light beam is a blue light beam, and the third light beam is a red light beam,
   wherein at least one photoelectric conversion device of the first photoelectric conversion device, the second photoelectric conversion device, or the third photoelectric conversion device includes an organic light absorbing material, a quantum dot, or a combination thereof.

2. The optical wireless communication system of claim 1, wherein the optical wireless transmitter includes
   a white light source configured to emit a white light beam including at least the first light beam, the second light beam, and the third light beam.

3. The optical wireless communication system of claim 1, wherein the optical wireless transmitter includes
   a first light source configured to emit the discrete-time signal of the first light beam,
   a second light source configured to emit the discrete-time signal of the second light beam, and
   a third light source configured to emit the discrete-time signal of the third light beam.

4. The optical wireless communication system of claim 1, wherein
   the third photoelectric conversion device at least partially overlaps the first photoelectric conversion device in the second direction, and
   the third photoelectric conversion device is distal to an incident light side of the optical wireless receiver in relation to the first photoelectric conversion device.

5. The optical wireless communication system of claim 1, wherein
   all of the first photoelectric conversion device, the second photoelectric conversion device, and the third photoelectric conversion device at least partially overlap each other in the second direction, and
   the first photoelectric conversion device and the second photoelectric conversion device are distal to an incident light side of the optical wireless receiver in relation to the third photoelectric conversion device.

6. The optical wireless communication system of claim 1, wherein
   the optical wireless receiver further includes
      a fourth photoelectric conversion device that is distal to an incident light side of the optical wireless receiver in relation to both the first photoelectric conversion device and the second photoelectric conversion device, and configured to selectively absorb a discrete-time signal of light in an infrared wavelength spectrum.

7. The optical wireless communication system of claim 6, wherein
the optical wireless transmitter includes at least one of
a fourth light source configured to emit an infrared light beam, or
a white light source configured to emit a white light beam including infrared light.

8. The optical wireless communication system of claim 6, wherein
the fourth photoelectric conversion device includes a quantum dot, a quinoid metal complex compound, a polymethine compound, a cyanine compound, a phthalocyanine compound, a merocyanine compound, a naphthalocyanine compound, an immonium compound, a diimmonium compound, a triarylmethane compound, a dipyrromethene compound, an anthraquinone compound, naphthoquinone, a diquinone compound, a naphthoquinone compound, a squarylium compound, a rylene compound, a perylene compound, a squaraine compound, a pyrylium compound, a thiopyrylium compound, a diketopyrrolopyrrole compound, a boron dipyrromethene compound, a nickeldithiol complex compound, a croconium compound, a derivative thereof, or a combination thereof.

9. The optical wireless communication system of claim 1, wherein the organic light absorbing material includes at least one of a compound represented by Chemical Formula 1, fullerene, or a fullerene derivative:

EDG-HA-EAG  [Chemical Formula 1]

wherein, in Chemical Formula 1,
HA is a C2 to C30 heterocyclic group having at least one of S, Se, Te, or Si,
EDG is an electron-donating group, and
EAG is an electron accepting group.

10. The optical wireless communication system of claim 1, wherein the quantum dot includes an alkaline metal-Group VI compound, a Group II-Group VI compound, a Group IV-Group VI compound, a Group III-Group V compound, a Group IV element or compound, graphene, or a combination thereof.

11. The optical wireless communication system of claim 1, wherein
at least one particular photoelectric conversion device of the first photoelectric conversion device, the second photoelectric conversion device, or the third photoelectric conversion device includes a p-type semiconductor and an n-type semiconductor, and
the p-type semiconductor and the n-type semiconductor of the at least one particular photoelectric conversion device form a pn junction.

12. The optical wireless communication system of claim 11, wherein
the at least one particular photoelectric conversion device includes an intrinsic layer (I layer) in which the p-type semiconductor and the n-type semiconductor are mixed in a bulk heterojunction form.

13. The optical wireless communication system of claim 12, wherein the at least one particular photoelectric conversion device further includes a p-type layer and/or n-type layer in direct contact with the intrinsic layer.

14. The optical wireless communication system of claim 12, wherein a volume ratio of the p-type semiconductor and the n-type semiconductor in the intrinsic layer is 9:1 to 1:9.

15. The optical wireless communication system of claim 1, wherein
a difference between a maximum absorption wavelength ($\lambda_{max2}$) of the second photoelectric conversion device and a maximum absorption wavelength ($\lambda_{max1}$) of the first photoelectric conversion device ranges from 30 nanometer (nm) to 200 (nm), and
a difference between the maximum absorption wavelength ($\lambda_{max1}$) of the first photoelectric conversion device and a maximum absorption wavelength ($\lambda_{max3}$) of the third photoelectric conversion device ranges from 30 (nm) to 200 (nm).

16. The optical wireless communication system of claim 1, wherein each photoelectric conversion device of the first photoelectric conversion device, the second photoelectric conversion device, and the third photoelectric conversion device has a light-receiving area of 0.1 micrometer$^2$ (µm$^2$) to 100 millimeter$^2$ (mm$^2$).

17. The optical wireless communication system of claim 1, wherein each photoelectric conversion device of the first photoelectric conversion device, the second photoelectric conversion device, and the third photoelectric conversion device includes
a first electrode and a second electrode facing each other and a photoelectric conversion layer between the first electrode and the second electrode.

18. The optical wireless communication system of claim 17, wherein each of the first electrode, the second electrode, and the photoelectric conversion layer has a thickness of 5 (nm) to 1100 (nm).

19. The optical wireless communication system of claim 1, wherein
the optical wireless receiver further includes
a data processor configured to processes each photoelectric conversion signal of the first photoelectric conversion signal, the second photoelectric conversion signal, and the third photoelectric conversion signal as noise, except for a photoelectric conversion signal having a greatest intensity of the first photoelectric conversion signal, the second photoelectric conversion signal, and the third photoelectric conversion signal, with reference to light in a particular wavelength spectrum belonging to visible and infrared wavelength spectra.

20. An optical wireless receiver, comprising:
a plurality of photoelectric conversion devices configured to convert separate, respective discrete-time signals of a plurality of light beams into separate, respective photoelectric conversion signals, the plurality of light beams having different wavelength spectra,
wherein at least two photoelectric conversion devices of the plurality of photoelectric conversion devices extend at least partially in parallel in a first direction and at least partially overlap each other in a second direction that is perpendicular to the first direction, wherein the at least two photoelectric conversion devices are configured to convert separate, respective discrete-time signals of a green light beam, a blue light beam, or a red light beam into separate, respective photoelectric conversion signals,
wherein at least one photoelectric conversion device of the plurality of photoelectric conversion devices includes an organic light absorbing material, a quantum dot, or a combination thereof, wherein
- the discrete-time signals of the plurality of light beams include a discrete-time signal of a first light beam, a discrete-time signal pf a second light beam, and a discrete-time signal of a third light beam,
- the plurality of photoelectric conversion devices includes
  - a first photoelectric conversion device configured to convert the discrete-time signal of the first light beam into a first photoelectric conversion signal,
  - a second photoelectric conversion device configured to convert the discrete-time signal of the second light beam into a second photoelectric conversion signal, and
  - a third photoelectirc conversion device configured to convert the discrete-time signal of the third light beam into a third photoelectric conversion signal,
- the second photoelectric conversion device extends at least partially in parallel with the first photoelectric conversion device in the first direction and at least partially overlaps the first photoelectric conversion device in the second direction, and
- the third photoelectric conversion device extends at least partially in parallel with both the first and second photoelectric conversion devices in the first direction and at least partially overlaps at least one photoelectric conversion device of the first photoelectric conversion device or the second photoelectric conversion device in the second direction.

21. The optical wireless receiver of claim 20, wherein
- the third photoelectric conversion device at least partially overlaps the first photoelectric conversion device in the second direction, and
- the third photoelectric conversion device is distal to an incident light side of the optical wireless receiver in relation to the first photoelectric conversion device.

22. The optical wireless receiver of claim 20, wherein
- all of the first photoelectric conversion device, the second photoelectric conversion device, and the third photoelectric conversion device at least partially overlap each other in the second direction, and
- the first photoelectric conversion device and the second photoelectric conversion device are distal to an incident light side of the optical wireless receiver in relation to the third photoelectric conversion device.

23. The optical wireless receiver of claim 20, wherein
- at least one photoelectric conversion device of the plurality of photoelectric conversion devices is configured to
  - convert a discrete-time signal of a light beam belonging to an infrared wavelength spectrum into a particular photoelectric conversion signal, or
  - convert a discrete-time signal of a light beam belonging to an ultraviolet wavelength spectrum into a separate particular photoelectric conversion signal.

* * * * *